United States Patent
Whetsel

(10) Patent No.: US 11,808,810 B2
(45) Date of Patent: Nov. 7, 2023

(54) AT-SPEED TEST ACCESS PORT OPERATIONS

(71) Applicant: TEXAS INSTRUMENTS INCORPORATED, Dallas, TX (US)

(72) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 18/111,679

(22) Filed: Feb. 20, 2023

(65) Prior Publication Data

US 2023/0194604 A1    Jun. 22, 2023

Related U.S. Application Data

(62) Division of application No. 17/692,057, filed on Mar. 10, 2022, now Pat. No. 11,585,852, which is a
(Continued)

(51) Int. Cl.
*G01R 31/3185* (2006.01)
*G06F 11/26* (2006.01)
(Continued)

(52) U.S. Cl.
CPC ... *G01R 31/3177* (2013.01); *G01R 31/31723* (2013.01); *G01R 31/31727* (2013.01);
(Continued)

(58) Field of Classification Search
None
See application file for complete search history.

(56) References Cited

U.S. PATENT DOCUMENTS

| 4,872,169 A | 10/1989 | Whetsel |
| 5,276,893 A | 1/1994 | Savaria |

(Continued)

FOREIGN PATENT DOCUMENTS

| CN | 1187244 A | 7/1998 |
| CN | 1656386 A | 8/2005 |

(Continued)

OTHER PUBLICATIONS

M. Lubaszewski, "Can Functional Test Achieve Low-cost Full Coverage of NoC Faults?," 2009 24th IEEE International Symposium on Defect and Fault Tolerance in VLSI Systems, Chicago, IL, USA, 2009, pp. 224-224, (Year: 2009).*

(Continued)

*Primary Examiner* — Cynthia Britt
(74) *Attorney, Agent, or Firm* — Carl G. Peterson; Frank D. Cimino

(57) ABSTRACT

In some examples, an integrated circuit comprises: a TDI input, a TDO output, a TCK input and a TMS input; a TAP state machine (TSM) having an input coupled to the TCK input, an input coupled to the TMS input, an instruction register control output, a TSM data register control (DRC) output, and a TSM state output; an instruction register having an input coupled to the TDI input, an output coupled to the TDO output, and a control input coupled to the instruction register control output of the TAP state machine; router circuitry including a TSM DRC input coupled to the TSM DRC output, a control DRC input coupled to the TSM state output, and a router DRC output; and a data register having an input coupled to the TDI input, an output coupled to the TDO output, and a data register DRC input coupled to the router DRC output.

13 Claims, 21 Drawing Sheets

Related U.S. Application Data division of application No. 17/117,532, filed on Dec. 10, 2020, now Pat. No. 11,287,473, which is a division of application No. 16/689,764, filed on Nov. 20, 2019, now Pat. No. 10,895,598, which is a division of application No. 16/183,347, filed on Nov. 7, 2018, now Pat. No. 10,520,551, which is a division of application No. 15/626,446, filed on Jun. 19, 2017, now Pat. No. 10,156,608, which is a division of application No. 15/336,101, filed on Oct. 27, 2016, now Pat. No. 9,733,308, which is a division of application No. 14/830,244, filed on Aug. 19, 2015, now Pat. No. 9,507,679, which is a division of application No. 14/179,754, filed on Feb. 13, 2014, now Pat. No. 9,146,825, which is a division of application No. 13/188,078, filed on Jul. 21, 2011, now Pat. No. 8,694,844.

(60) Provisional application No. 61/406,674, filed on Oct. 26, 2010, provisional application No. 61/368,906, filed on Jul. 29, 2010.

(51) Int. Cl.

| | | |
|---|---|---|
| *G01R 31/3177* | (2006.01) | |
| *H10K 50/814* | (2023.01) | |
| *H10K 50/816* | (2023.01) | |
| *H10K 50/844* | (2023.01) | |
| *H10K 59/122* | (2023.01) | |
| *H10K 59/123* | (2023.01) | |
| *H10K 59/124* | (2023.01) | |
| *H10K 59/121* | (2023.01) | |
| *H10K 71/00* | (2023.01) | |
| *G01R 31/317* | (2006.01) | |
| *H10K 59/12* | (2023.01) | |
| *H10K 102/00* | (2023.01) | |
| *H10K 102/10* | (2023.01) | |
| *H01L 27/12* | (2006.01) | |

(52) U.S. Cl.
CPC ............... *G01R 31/318555* (2013.01); *G01R 31/318572* (2013.01); *G06F 11/26* (2013.01); *H10K 50/814* (2023.02); *H10K 50/816* (2023.02); *H10K 50/844* (2023.02); *H10K 59/122* (2023.02); *H10K 59/123* (2023.02); *H10K 59/124* (2023.02); *H10K 59/1213* (2023.02); *H10K 71/00* (2023.02); *H01L 27/1222* (2013.01); *H01L 27/1225* (2013.01); *H01L 27/1248* (2013.01); *H10K 59/1201* (2023.02); *H10K 2102/00* (2023.02); *H10K 2102/103* (2023.02)

(56) References Cited

U.S. PATENT DOCUMENTS

| | | | |
|---|---|---|---|
| 5,812,562 A | 9/1998 | Baeg | |
| 5,887,001 A | 3/1999 | Russell | |
| 6,000,051 A | 12/1999 | Nadeau-Dostie | |
| 6,334,198 B1 | 12/2001 | Adusumilli | |
| 6,378,090 B1 | 4/2002 | Bhattacharya | |
| 6,625,767 B1 | 9/2003 | Ayrignac | |
| 6,631,504 B2 | 10/2003 | Dervisoglu et al. | |
| 6,754,863 B1 | 6/2004 | Grannis, III | |
| 6,760,874 B2 | 7/2004 | Code | |
| 6,886,121 B2 | 7/2005 | Dervisoglu | |
| 7,073,110 B1 | 7/2006 | Jacobson | |
| 7,181,705 B2 | 2/2007 | Dervisoglu | |
| 7,428,674 B1* | 9/2008 | Jacobson | ....... G01R 31/318555 |
| | | | 716/108 |
| 7,519,884 B2 | 4/2009 | Whetsel | |
| 7,529,996 B2 | 5/2009 | Whetsel | |
| 8,694,844 B2 | 4/2014 | Whetsel | |
| 9,146,825 B2 | 9/2015 | Whetsel | |
| 10,520,551 B2 | 12/2019 | Whetsel | |
| 2003/0188240 A1 | 10/2003 | Perner | |
| 2004/0006729 A1* | 1/2004 | Pendurkar | ............... G11C 29/32 |
| | | | 714/733 |
| 2006/0090110 A1 | 4/2006 | Steinbusch | |
| 2007/0061646 A1 | 3/2007 | Whetsel | |
| 2007/0234154 A1 | 10/2007 | Whetsel | |
| 2009/0300447 A1 | 12/2009 | Whetsel | |
| 2010/0031104 A1 | 2/2010 | Swoboda | |
| 2019/0072612 A1 | 3/2019 | Whetsel | |

FOREIGN PATENT DOCUMENTS

| | | |
|---|---|---|
| CN | 101471142 A | 7/2009 |
| CN | 101545951 A | 9/2009 |
| JP | 2001519947 A | 10/2001 |
| JP | 2008164470 A | 7/2008 |

OTHER PUBLICATIONS

A. M. Amory, E. Briao, E. Cota, M. Lubaszewski and F. G. Moraes, "A scalable test strategy for network-on-chip routers," IEEE International Conference on Test, 2005., Austin, TX, 2005, pp. 9 pp. -599.

Chunsheng Liu, Z. Link and D. K. Pradhan, "Reuse-based test access and integrated test scheduling for network-on-chip," Proceedings of the Design Automation & Test in Europe Conference, Munich, 2006, pp. 6 10.1109/DATE.2006.244143.

Li-Chung Hsu, Hung-Ming Chen, "On optimizing scan testing power and routing cost in scan chain design," Quality Electronics Design, 2006. ISQED '06.7th International Symposium on, vol. No., pp. 6, pp. 456, Mar. 27-29, 2006.

C. J. Clark, "iMajik: Making 1149.1 TAPs disappear and reappear in SoCs and 3D packages," 2010 28th VLSI Test Symposium (VTS), Santa Cruz, CA, 2010, pp. 117-122.

Zhu Min, Yang Chunling and Peng NZhang, "Design of IEEE1149.1 testing bus controller IP core," 2009 4th IEEE Conference on Industrial Electronics and Applications, Xi'an, 2009, pp. 408-413.

Lee Whetsel, "Commanded Test Access Port operations", International Test Conference, Paper 19.3, 2010, pp. 1-10.

\* cited by examiner

AT-SPEED TEST ACCESS PORT OPERATIONS

CROSS-REFERENCE TO RELATED APPLICATIONS

This Application is a divisional of prior application Ser. No. 17/692,057, filed Mar. 10, 2022, currently pending and scheduled to issue as U.S. Pat. No. 11,585,852 on Feb. 21, 2023;

Which was a divisional of prior application Ser. No. 17/117,532, filed Dec. 10, 2020, now U.S. Pat. No. 11,287,473, issued Mar. 29, 2022;

Which was a divisional of prior application Ser. No. 16/689,764, filed Nov. 20, 2019, now U.S. Pat. No. 10,895,598, issued Jan. 19, 2021;

Which was a divisional of prior application Ser. No. 16/183,347, filed Nov. 7, 2018, now U.S. Pat. No. 10,520,551, issued Dec. 21, 2019;

Which was a divisional of prior application Ser. No. 15/626,446, filed Jun. 19, 2017, now U.S. Pat. No. 10,156,608, issued Dec. 18, 2018;

Which was a divisional of prior application Ser. No. 15/336,101, filed Oct. 27, 2016, now U.S. Pat. No. 9,733,308, issued Aug. 15, 2017;

Which was a divisional of prior application Ser. No. 14/830,244, filed Aug. 19, 2015, now U.S. Pat. No. 9,507,679, issued Nov. 29, 2016;

Which was a divisional of prior application Ser. No. 14/179,754, filed Feb. 13, 2014, now U.S. Pat. No. 9,146,825, issued Sep. 19, 2015;

Which was a divisional of prior application Ser. No. 13/188,078, filed Jul. 21, 2011; now U.S. Pat. No. 8,694,844, issued Apr. 8, 2014;

Which claims priority from Provisional Application No. 61/368,906, filed Jul. 29, 2010, And also claims priority from Provisional Application No. 61/406,674, filed Oct. 26, 2010.

FIELD OF THE INVENTION

This disclosure relates generally to IEEE 1149.1 Test Access Ports and in particular to operational improvements to IEEE 1149.1 Test Access Ports.

RELATED ART

This disclosure is related to U.S. Pat. No. 7,404,129 and patent application Ser. No. 12/410,561, now U.S. Pat. No. 8,046,651, issued Oct. 25, 2011, and application Ser. No. 13/028,575, now U.S. Pat. No. 8,572,433, issued Oct. 29, 2031, all incorporated herein by reference.

BACKGROUND

The IEEE 1149.1 Test Access Port (TAP) is used widely in the semiconductor industry as an IC interface for controlling many types of embedded IC circuits, such as but not limited to test circuits, debug circuits, programming circuits, instrumentation circuits and trace circuits. The TAP has proven for the last 20 years to be effective in controlling the operations of embedded IC circuits. However, the TAP has not proven to be effective in controlling the operations of embedded IC circuits that depend on at-speed Update & Capture and Shift & Capture operations. The first part of this disclosure (FIGS. 1-7) describes the at-speed Update & Capture and Shift & Capture problem. The second part of this disclosure (FIGS. 8-41) describes novel solutions to this problem using various examples of implementation.

SUMMARY OF THE DISCLOSURE

This disclosure describes novel solutions to solve the TAP's at-speed Update & Capture and Shift & Capture problem by augmenting the TAP with additional circuitry. In the first disclosed solution of FIGS. 8-28, the at-speed operations are achieved by time division multiplexing CMD signals onto the TMS input to the TAP and inputting the CMD signals to a command (CMD) circuit that controls the at-speed operations of a data register. In the second disclosed solution of FIGS. 29A-33, the at-speed operations are achieved by detecting the TAP's Exit1DR state to produce the CMD signals to the CMD circuit that controls the at-speed operations of a data register. In the third disclosed solution of FIGS. 34A-38, the at-speed operations are achieved by detecting the TAP's Exit1DR and PauseDR states to produce at-speed Update and Capture signals that are input a data register via a Programmable Switch (PSW) circuit. In the fourth disclosed solution of FIGS. 39-41, the at-speed operations are achieved by detecting the TAP's Exit1DR and PauseDR states to produce at-speed Update and Capture signals that are input to a data register via a Dual Port Router. All the disclosed solutions may be augmented with externally accessible Update and Capture signals to allow a tester to directly control the at-speed operations of a data register.

DETAILED DESCRIPTION

Figure 1:
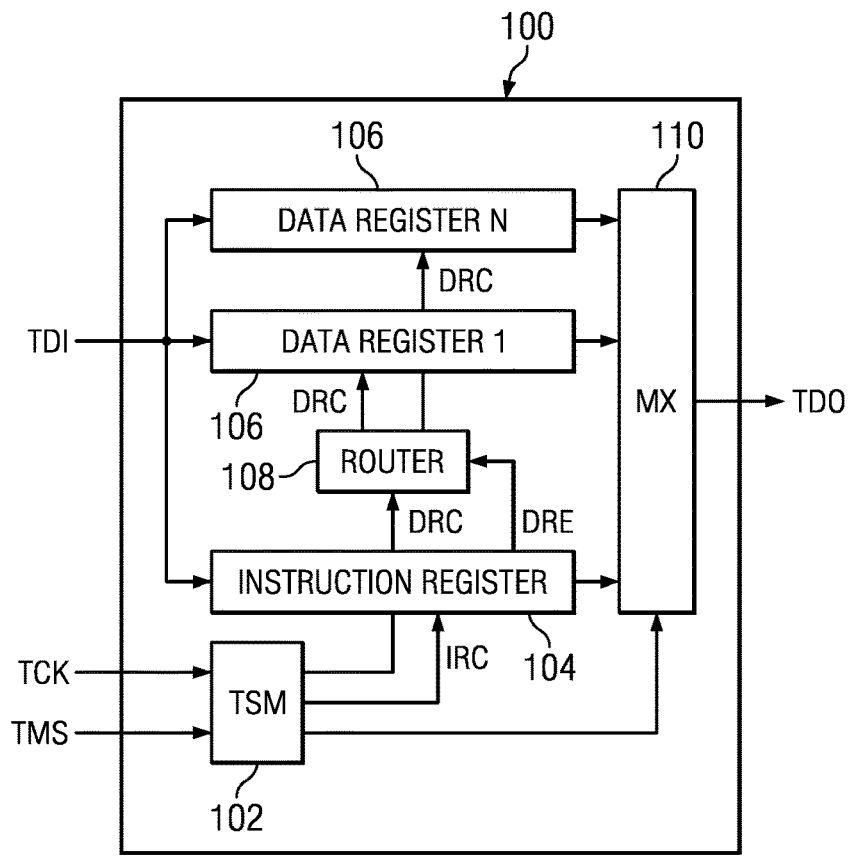
FIG. 1 illustrates an IEEE 1149.1 TAP architecture.
Figure 3:
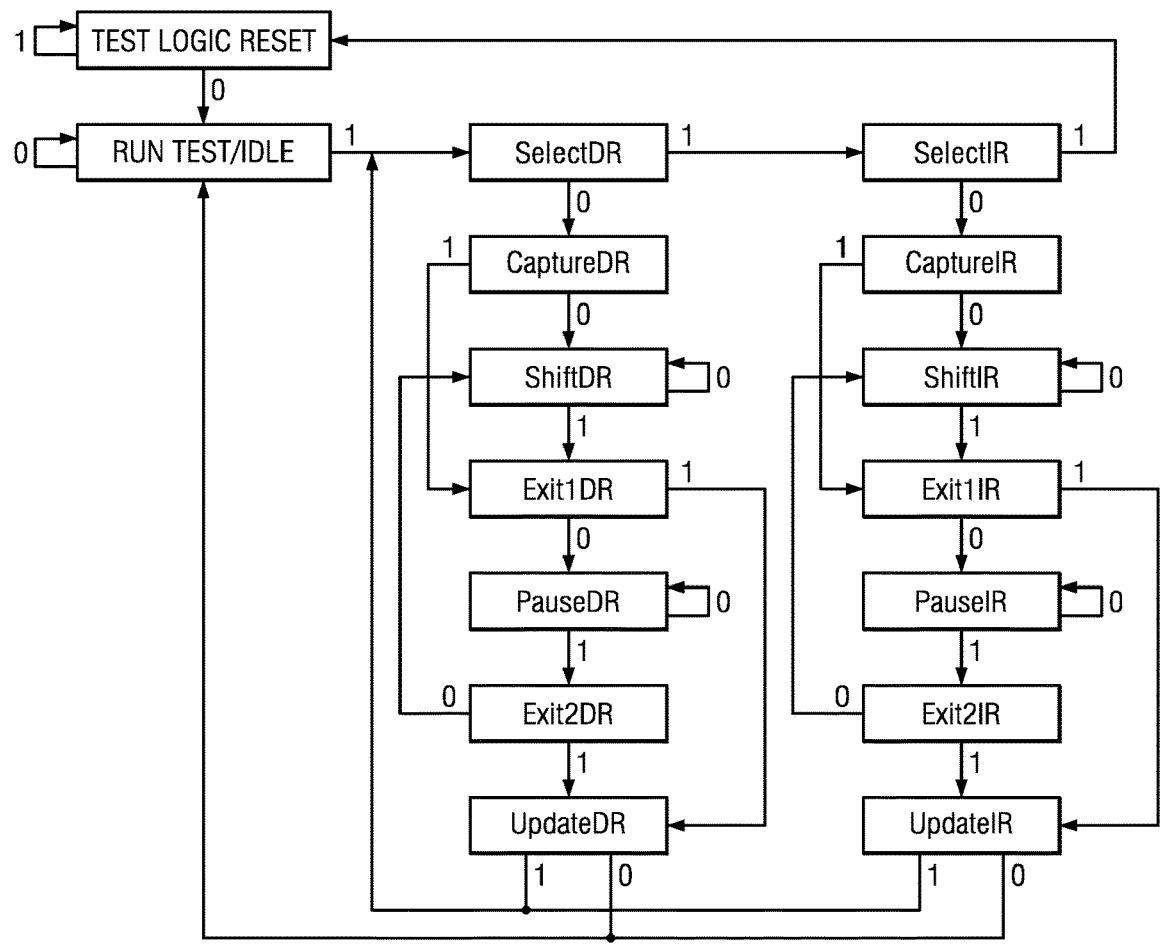
FIG. 3 illustrates the state diagram of the TSM.

FIG. 1 illustrates a prior art example TAP architecture 100 consisting of a TAP state machine (TSM) 102, an instruction register 104, data registers 106, a Data Register Control (DRC) signal Router 108 and TDO multiplexer 110. The TSM operates through states shown in FIG. 3 to; (1) place the TAP in a Test Logic Reset state, (2) place the TAP in a Run Test/Idle state, (3) perform an instruction register scan operation or (4) perform a data register scan operation. The instruction register outputs Data Register Enable (DRE) signals that select the TSM's DRC signals to pass through the Router to a data register to be accessed.

Figure 2:
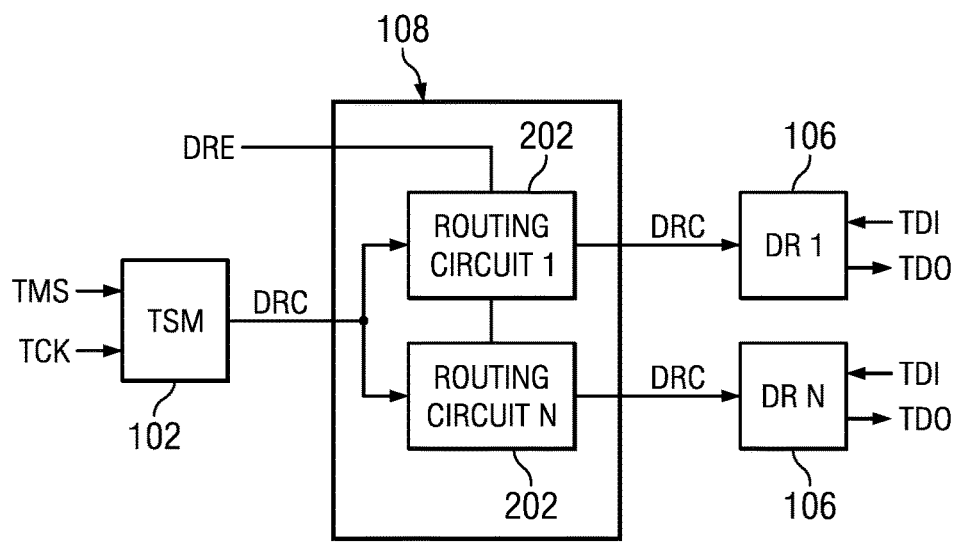
FIG. 2 illustrates a Router circuit for routing Tap State Machine (TSM) data register control (DRC) signals to a data register.

FIG. 2 illustrates the Router 108 which consists of routing circuits 202 that connect the TSM's DRC outputs to the DRC inputs of a data register 106. Once connected the data register can be accessed from TDI to TDO by transitioning the TAP state machine through its SelectDR, CaptureDR, ShiftDR, Exit1DR and UpdateDR states, as shown in the TAP's TSM state diagram of FIG. 3.

Figure 4:
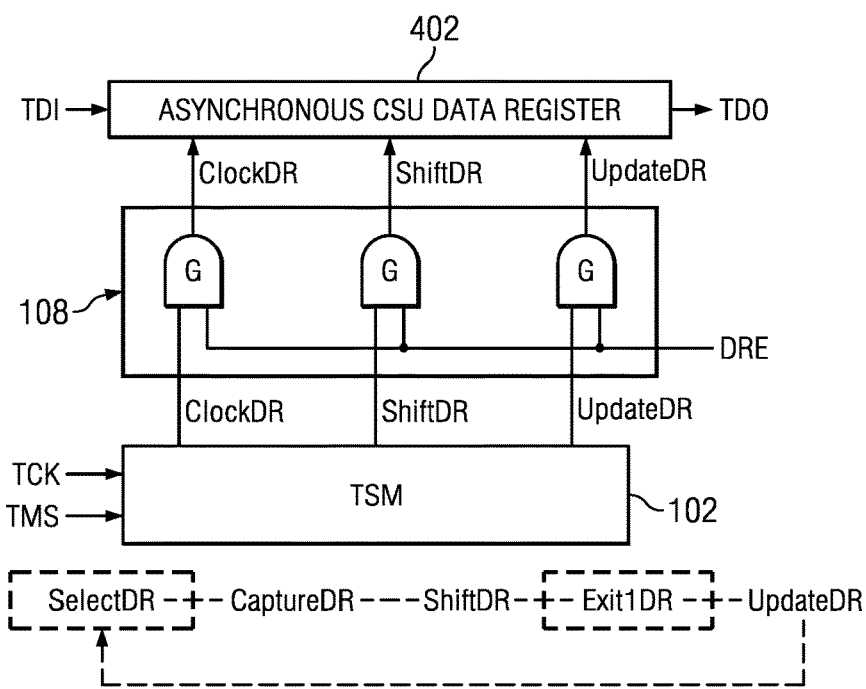
FIG. 4 illustrates an asynchronous CSU data register being control by the TSM, via a router.

FIG. 4 illustrates an asynchronous Capture, Shift and Update (CSU) data register 402 connected to the TSM 102 via a routing circuit 108. The routing circuit 108 in this and other following routing circuit examples, consists of gating circuits that allow the TSM to control the data register 402 when it has been selected for access by DRE instruction inputs. Asynchronous means the data register is timed by the TSM's gated ClockDR output. CSU type data registers, such as IEEE 1149.1 boundary scan registers, are well known. In response to DRE input, the gating circuits of the router circuit connect the TSM's ClockDR, ShiftDR and UpdateDR outputs, all known in the art, to the data registers ClockDR, ShiftDR and UpdateDR inputs. Once connected, the TSM transitions through its SelectDR, CaptureDR, ShiftDR, Exit1DR and UpdateDR states of FIG. 3 to operate the data register. When the data register is not being accessed by the TSM, the gating circuits of routing circuit 108 are set by DRE inputs to place the data register's ClockDR, ShiftDR and UpdateDR inputs to inactive states.

Figure 5:
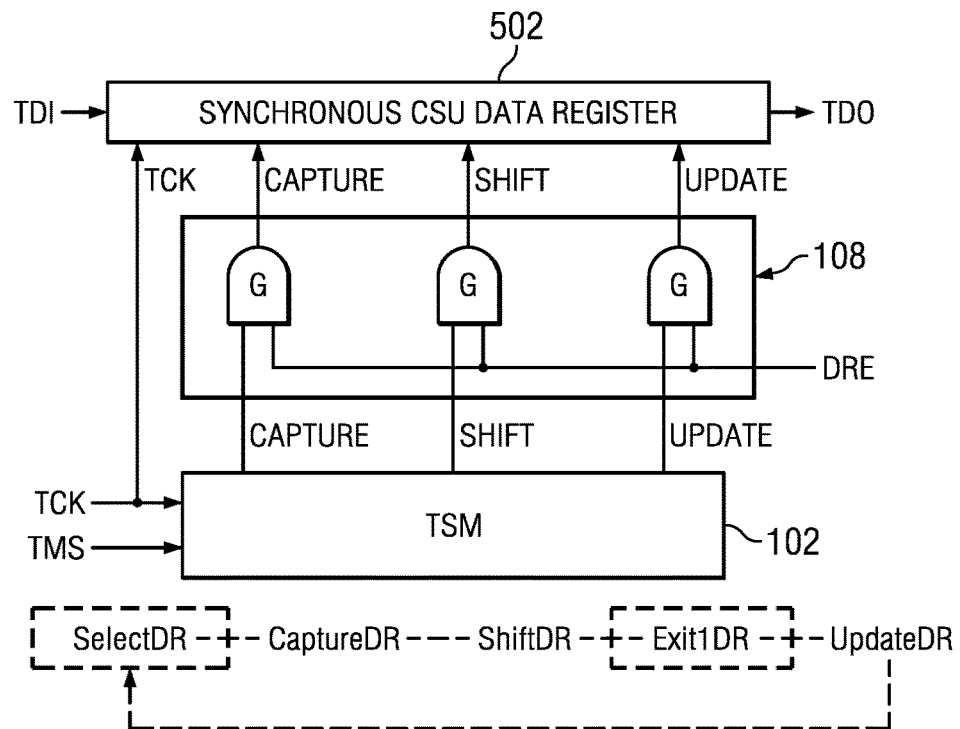
FIG. 5 illustrates a synchronous CSU data register being control by the TSM, via a router.

FIG. 5 illustrates a synchronous CSU data register 502 connected to the TSM 102 via a routing circuit 108. Synchronous means the data register is timed by the TCK signal. Synchronous operation requires the data register's scan cells to provide a holding state such that when the data register is not performing a Capture, Shift or Update operation it maintains it's current state. The Capture signal indicates the TSM is in the CaptureDR state of FIG. 3, the Shift signal indicates the TSM is in the ShiftDR state of FIG. 3, the Update signal indicates the TSM is in the UpdateDR state of FIG. 3. In response to DRE input, the routing circuit connects the TSM's Capture, Shift and Update state outputs to the data registers Capture, Shift and Update inputs. Once connected the TSM transitions through its SelectDR, CaptureDR, ShiftDR, Exit1DR and UpdateDR states of FIG. 3 to operate the data register. When the data register is not being accessed by the TSM, the gating circuits of routing circuit 108 are set by DRE inputs to place the data register's Capture, Shift and Update inputs to inactive states.

Figure 6:
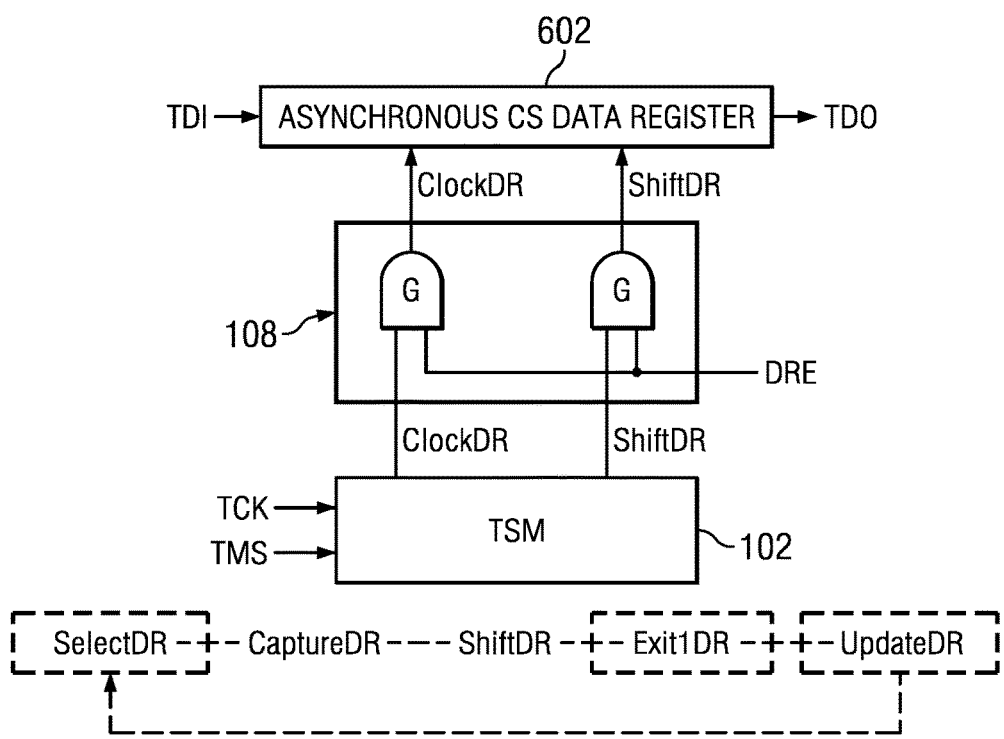
FIG. 6 illustrates an asynchronous CS data register being control by the TSM, via a router.

FIG. 6 illustrates an asynchronous Capture and Shift (CS) data register 602 connected to the TSM 102 via a routing circuit 108. CS type data registers, such as internal scan path registers are well known. In response to DRE input, the routing circuit connects the TSM's ClockDR and ShiftDR outputs to the data registers ClockDR and ShiftDR inputs. Once connected, the TSM transitions through its SelectDR, CaptureDR, ShiftDR, Exit1DR and UpdateDR states of FIG. 3 to operate the data register. When the data register is not being accessed by the TSM, the gating circuits of routing circuit 108 are set by DRE inputs to place the data register's ClockDR and ShiftDR inputs to inactive states.

Figure 7:
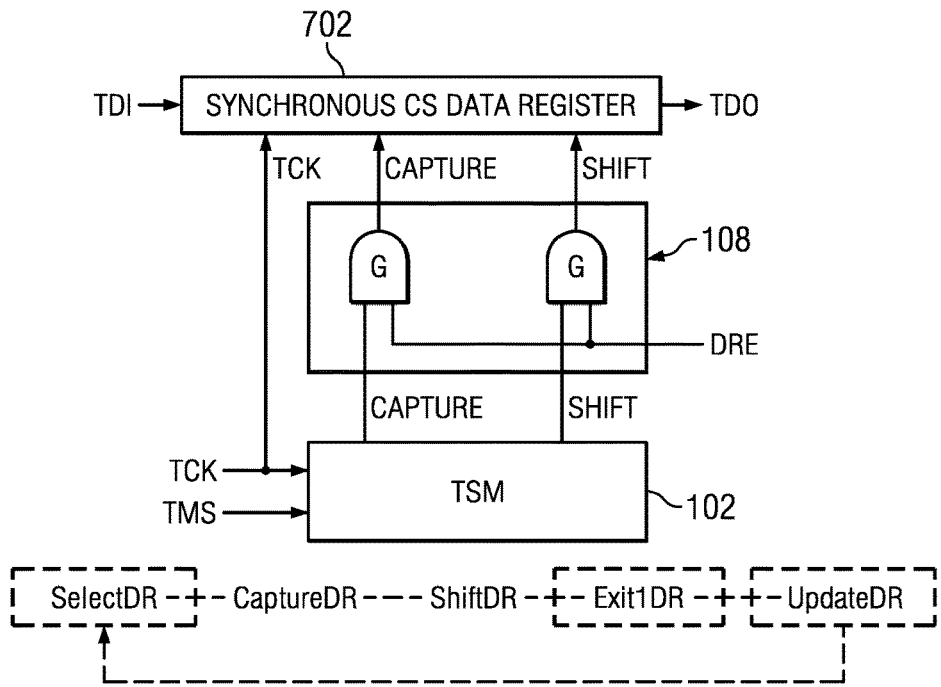
FIG. 7 illustrates a synchronous CS data register being control by the TSM, via a router.

FIG. 7 illustrates a synchronous CS data register 702 connected to the TSM 102 via a routing circuit 108. In response to DRE input, the routing circuit connects the TSM's Capture and Shift state outputs to the data registers Capture and Shift inputs. Once connected, the TSM transitions through its SelectDR, CaptureDR, ShiftDR, Exit1DR and UpdateDR states of FIG. 3 to operate the data register. When the data register is not being accessed by the TSM, the gating circuits of routing circuit 108 are set by DRE inputs to place the data register's Capture and Shift inputs to inactive states.

The TSM state transitions of the CSU scan cycles of FIGS. 4 and 5 illustrate the problematic dead states SelectDR and Exit1DR in dotted line boxes. When an Update operation occurs in the UpdateDR state it takes 2 and one half TCKs before a capture operation occurs in the CaptureDR state. This prevents at-speed Update & Capture scan operations. The TSM state transitions of the CS scan cycles of FIGS. 6 and 7 illustrate the problematic dead states SelectDR, Exit1DR and UpdateDR in dotted line boxes. When the last shift operation occurs in the ShiftDR state it takes 4 TCKs before a capture operation occurs in the CaptureDR state. This prevents at-speed Shift & Capture scan operations.

The dead states of FIGS. 4-7, that prevent at-speed CSU and CS scan operations, are well known in the industry. Many solutions have been proposed to address this problem. Some of the early solutions are described and referenced below.

Solution 1—Chapter 18 of IEEE Computer Society Press "The Test Access Port and Boundary Scan Architecture" 1990, by Maunder. This solution defined a ScanTest instruction that can be loaded into the TAP instruction register that "reprograms" the TSM state assignments to where at-speed capture operations can occur after the last shift operation. This solution eliminates the dead states in CS scan operations but does not eliminate the dead states in CSU scan operations. Also the solution only applies to standalone device testing, i.e. it cannot be used when the device is daisy-chained with other devices.

Solution 2—Paper "Built-In-Test Using Boundary Scan", ATE & Instrumentation Conference, 1989, pg 15-22 by Whetsel. This solution defined BIST and DelayTest instructions that can be loaded into the TAP instruction register and executed in the Run Test/Idle state to perform at-speed update and capture operations. This solution does not address the dead state problem in CSU and CS scan operations.

Solution 3—Paper "Early Capture for Boundary Scan Timing Measurements, IEEE International Test Conference", 1996 by Lofstrom. This solution defined an Early-Capture instruction that can be loaded into the TAP instruction register to allow the TMS signal to be used as a capture clock that can be applied after an update operation. This solution provides an at-speed update and capture operation, but it does not eliminate the need to traverse the dead states. It also only works with CSU scan operations, not CS scan operations.

Solution 4—IEEE Standard 1149.6, "A Standard for Boundary Scan Testing of Advanced Digital Networks". This solution was based on a new standard (IEEE 1149.6) that defines new instructions (ExtestPulse & ExtestTrain) that allow at-speed update and capture operations to be executed in the Run Test/Idle state. Like solution 2, this solution does not address the dead state problem in CSU and CS scan operations.

First Disclosed Solution—FIGS. 8-33

The first solution described in this disclosure to eliminate the problematic dead states of FIGS. 4-7 involves augmenting the TAP 100 with a Command circuit and a Dual Port Router. The Command circuit and Dual Port Router can operate while the TSM 102 is in the ShiftDR state of FIG. 3 to perform at-speed Update and Capture operations on CSU data registers and at-speed Shift and Capture operations on CS data registers.

Figure 8:
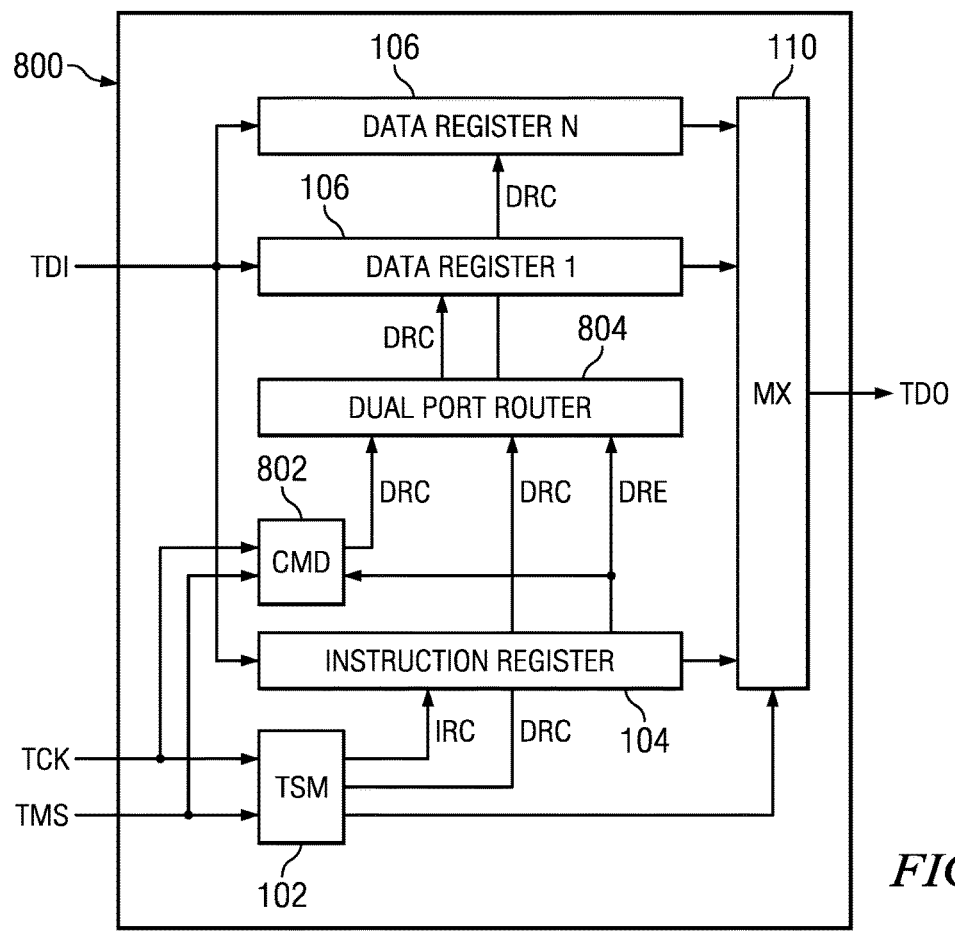
FIG. 8 illustrates an IEEE 1149.1 TAP augmented with a command (CMD) circuit and Dual Port Router according to the disclosure.

FIG. 8 illustrates a TAP 800 that has been augmented with a Command (CMD) circuit 802 and a Dual Port Router 804, otherwise TAP 800 is the same as TAP 100 of FIG. 1. The CMD circuit 802 has inputs connected to the TCK, TMS, DRE and DRC outputs. One port of the Dual Port Router 804 is connected to the DRC outputs of the CMD circuit and the other port is connected to the DRC outputs of the TSM. The DRE signals from the instruction register enable or disable the CMD circuit. The DRE signals also control the Dual Port Router such that the Router's DRC outputs to a data register 106 may be controlled by the TSM 102 as previously described or by the CMD circuit 804.

Figure 9:
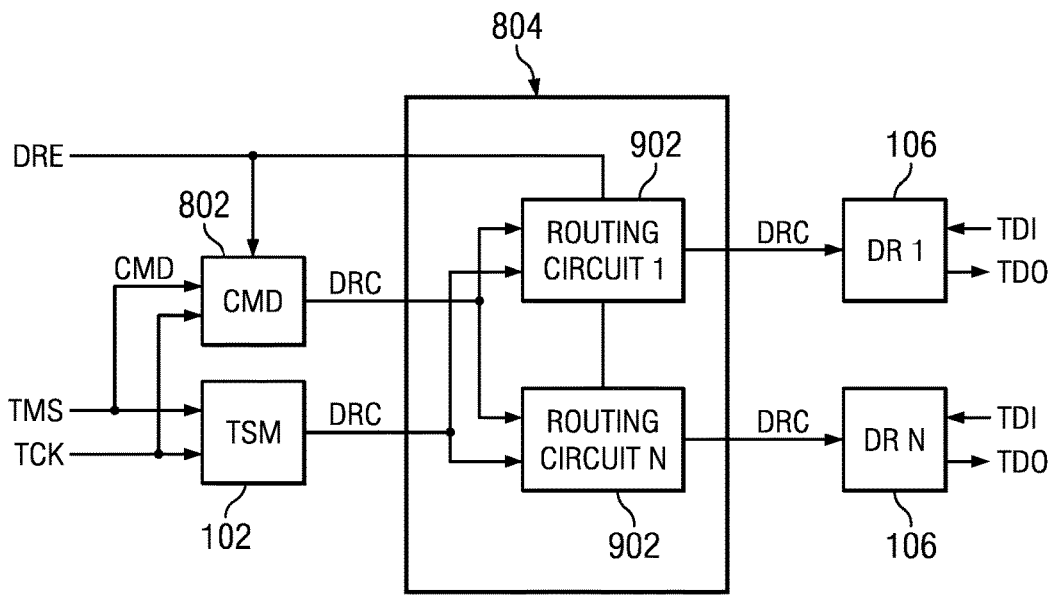
FIG. 9 illustrates a Dual Port Router circuit for routing DRC signals from a TSM or a CMD circuit to data registers according to the disclosure.

FIG. 9 illustrates an example Dual Port Router 804 which consists of routing circuits 902 that, in response to the DRE inputs, connect the DRC outputs from the TSM to the DRC inputs of a selected data register 106 or connect the DRC outputs of the CMD circuit to the DRC inputs of a selected data register 106. If the data register is connected to the DRC outputs of the TSM it can be accessed for CSU or CS scan operations that are controlled by the TSM, as previously described. If the data register is connected to the DRC outputs of the CMD circuit it can be accessed for CSU or CS scan operations that are controlled by the CMD circuit.

Figure 10:
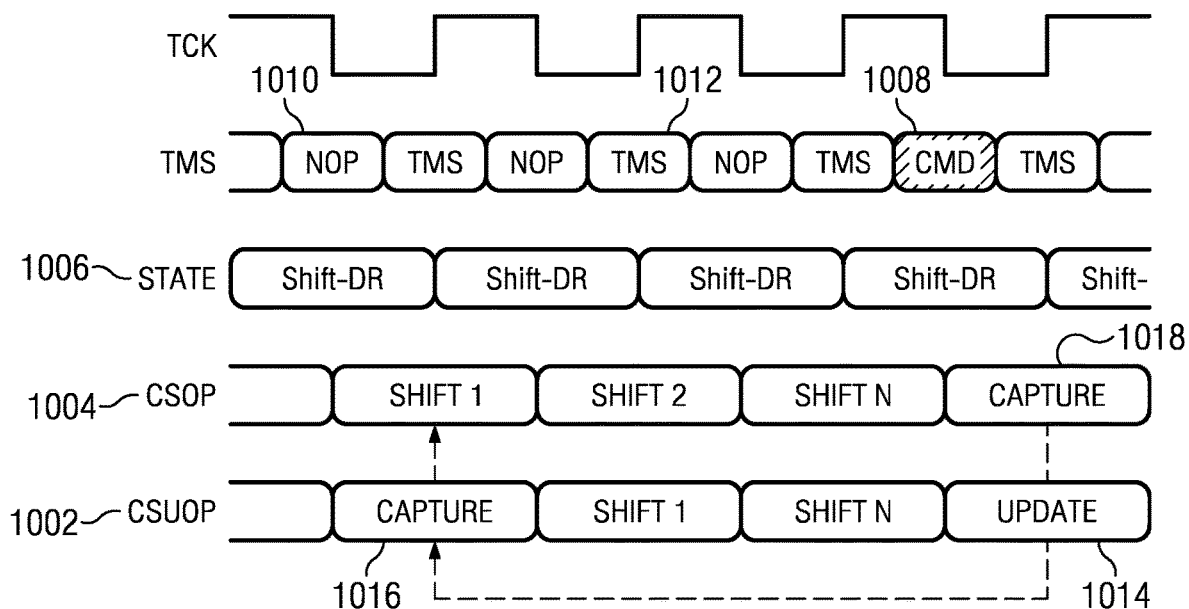
FIG. 10 illustrates the timing diagram for performing CS or CSU operations using the CMD circuit according to the disclosure.

FIG. 10 illustrates the timing of performing a CSU scan operation (CSUOP) 1002 or a CS scan operation (CSOP) 1004 using the CMD circuit. When the CMD circuit is being used to access a data register, the TSM will transition to and remain in the ShiftDR state 1006. In the ShiftDR state, the data register shifts data from TDI to TDO. At appropriate times during the shifting, CMD signals 1008 are input to the CMD circuit on the falling edge of TCK via the TMS signal. Between CMD signal inputs, No Operation (NOP) signals 1010 are input to the CMD circuit on the falling edge of TCK via TMS. During CMD controlled access to the data register, the TSM continues to receive normal TMS inputs 1012 on the rising edge of TCK to maintain the TSM in the ShiftDR state. At the end of a CMD circuit controlled scan operation, the TSM will receive TMS input to transition out of the ShiftDR state to terminate the data register access operation.

As seen in FIG. 10, if a CSU type data register is being accessed, a CSUOP will be performed in response to a CMD signal input. The CSUOP performs an Update operation 1014 after the last Shift (Shift N) operation, performs a Capture operation 1016 and then resumes the Shift operation. This Update, Capture and Shift sequence is repeated each time a CMD signal is input on TMS. Since the TSM remains in the ShiftDR state while the CMD circuit controls the CSU data register, there are no dead states in the CSUOP cycles of FIG. 10.

Also as seen in FIG. 10, if a CS type data register is being accessed, a CSOP will be performed in response to a CMD signal input. The CSOP performs a Capture operation 1018 after the last Shift (Shift N) operation then resumes the Shift operation. This Capture and Shift sequence is repeated each time a CMD signal is input on TMS. Since the TSM remains in the ShiftDR state while the CMD circuit controls the CS data register, there are no dead states in the CSOP cycles of FIG. 10.

Figure 11:
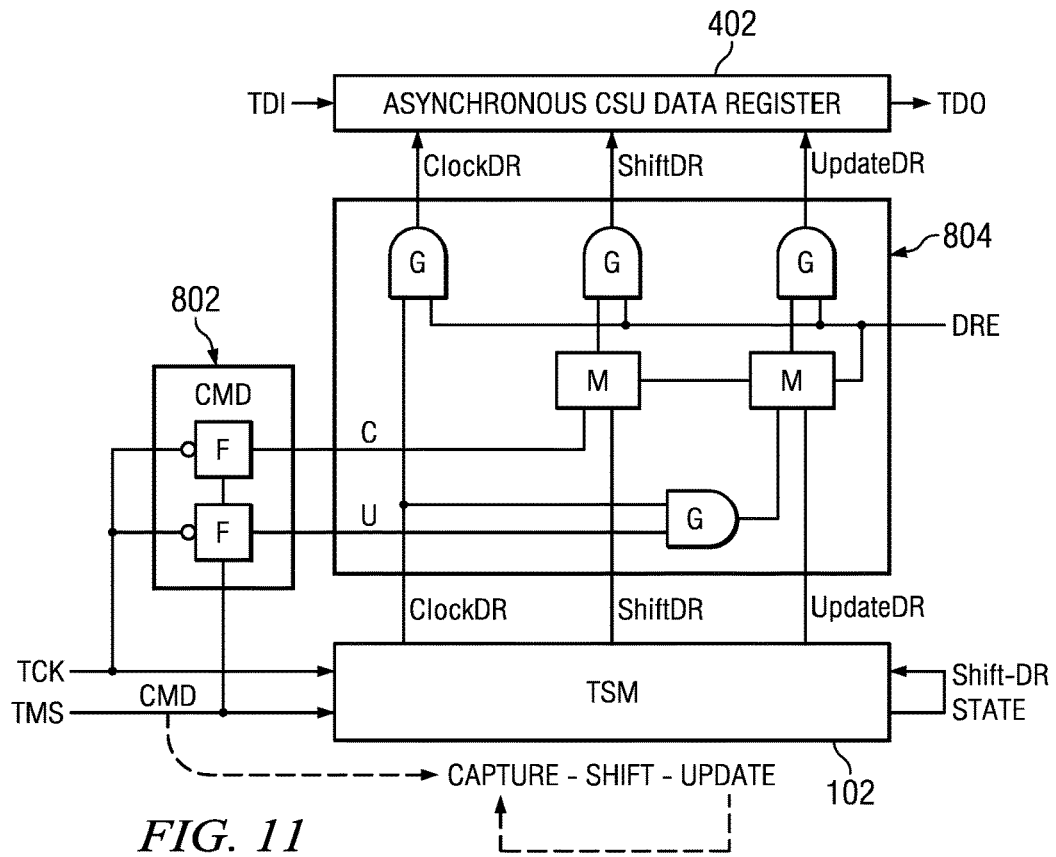
FIG. 11 illustrates an asynchronous CSU data register being control by either the TSM or CMD circuit, via a Dual Port Router according to the disclosure.

FIG. 11 illustrates the asynchronous CSU data register 402 of FIG. 4 connected to the TSM and a CMD circuit via an example Dual Port Router 804. The DRE inputs control the Dual Port Router to allow the data register to be accessed by the TSM as described in FIG. 4 or by the CMD circuit as described in FIG. 10. The CMD circuit in this example is simply two serially connected FFs that input the CMD signal from TMS on the falling edge of TCK.

The Dual Port Router 804 in this example is simply multiplexers and gating connected as shown that are controlled by the DRE input from the instruction register. When the data register is to be controlled by the TSM, the DRE input routes the ClockDR, ShiftDR and UpdateDR outputs from the TSM through the Dual Port Router to the ClockDR, ShiftDR and UpdateDR inputs of the data register. When the data register is to be controlled by the CMD circuit, the DRE input routes the Capture (C) and Update (U) signals from the CMD circuit and the ClockDR signal from the TSM through the Dual Port Router to the ClockDR, ShiftDR and UpdateDR inputs of the data register. The ClockDR output from the TSM will be running since the TSM will be in the ShiftDR state. The first port of this example Dual Port Router is defined as being the ClockDR, ShiftDR and UpdateDR inputs from the TSM. The second port of this example Dual Port Router is defined as being the Capture (C) and Update (U) inputs from the CMD circuit and the ClockDR input from the TSM.

During access by the CMD circuit, the first FF inputs the CMD signal from TMS and outputs the Update (U) signal to the Dual Port Router which outputs the UpdateDR signal to the data register to cause the data register to perform an Update operation. The Update (U) signal from the CMD circuit is gated with the ClockDR signal from the TSM to produce an update clock pulse on the UpdateDR input to the data register on the rising edge of TCK. The CMD signal is then shifted into the second FF which outputs a Capture (C) signal to the Dual Port Router which outputs a logic level on the ShiftDR signal to the data register to cause the data register to perform a Capture operation on the next rising edge of ClockDR, which is driven by TCK. The Update (U) and Capture (C) signals are stable during the rising edge ClockDR operations since they are registered in the FFs on the falling edge of TCK. The Update and Capture operation sequence is repeated each time a CMD signal is input to the CMD circuit. While this example Dual Port Router produces the update clock pulse on the rising edge of ClockDR another example Dual Port Router could produce the update clock pulse on the falling edge of ClockDR if desired.

While not shown in FIG. 11, the FFs of the CMD circuit of this and other following CMD circuit examples will be initialized by the DRE input at the beginning of a data register test access operation, as shown in FIG. 9, such that the Update (U) and Capture (C) outputs are not asserted until a CMD signal is received.

Figure 12:
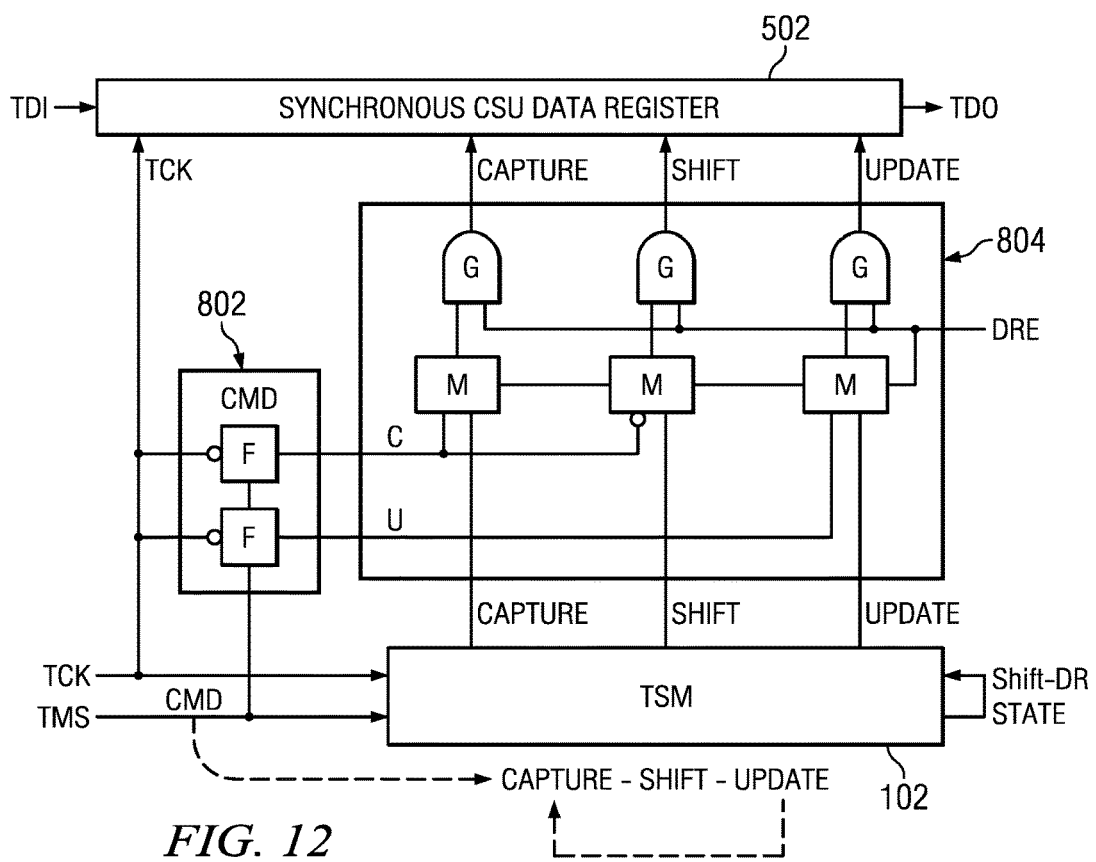
FIG. 12 illustrates a synchronous CSU data register being control by the TSM or CMD circuit, via a Dual Port Router according to the disclosure.

FIG. 12 illustrates the synchronous CSU data register 502 of FIG. 5 connected to the TSM 102 and the CMD circuit 802 of FIG. 11 via an example Dual Port Router 804. The DRE inputs control the Dual Port Router to allow the data register to be accessed by the TSM as described in FIG. 5 or by the CMD circuit as described in FIG. 10. The data register is clocked by the free running TCK.

The Dual Port Router 804 in this example is simply multiplexers and gating connected as shown that are controlled by the DRE input from the instruction register. When the data register is to be controlled by the TSM, the DRE input routes the Capture, Shift and Update state outputs from the TSM through the Dual Port Router to the Capture, Shift and Update inputs of the data register. The Capture state signal is asserted when the TSM is in the CaptureDR state, the Shift state signal is asserted when the TSM is in the ShiftDR state and the Update state signal is asserted when the TSM is in the UpdateDR state. When the data register is to be controlled by the CMD circuit, the DRE input routes the Capture (C) and Update (U) signals from the CMD circuit through the Dual Port Router to the Capture, Shift and Update inputs of the data register. The Capture (C) input from the TSM sets the Capture and Shift inputs of the data register to states that cause the data register to shift or capture data. In this example, if Capture (C) is low, the Capture and Shift inputs to the data register are set low and high respectively, causing the data register to shift data from TDI to TDO and if Capture (C) is high, the Capture and Shift inputs to the data register are set high and low respectively, causing the data register to capture data. The first port of this example Dual Port Router is defined as being the Capture, Shift and Update state outputs from the TSM. The second port of this example Dual Port Router is defined as being the Capture (C) and Update (U) inputs from the CMD circuit.

During access by the CMD circuit, the first FF inputs the CMD signal from TMS and outputs an Update (U) signal to the Dual Port Router which outputs the Update signal to cause the data register to perform an Update operation. The CMD signal is then shifted into the second FF which outputs a Capture (C) signal to the Dual Port Router which outputs Capture and Shift signals to cause the data register to perform a Capture operation. The Capture, Shift and Update data register operation of this example occurs on the rising edge of the free running TCK. If desired the Update circuitry in the data register could be designed to operate in the response to the Update signal on the falling edge of TCK by simple inverting the TCK input to the Update circuitry. The Update and Capture operation sequence is repeated each time a CMD signal is input to the CMD circuit.

Figure 13:
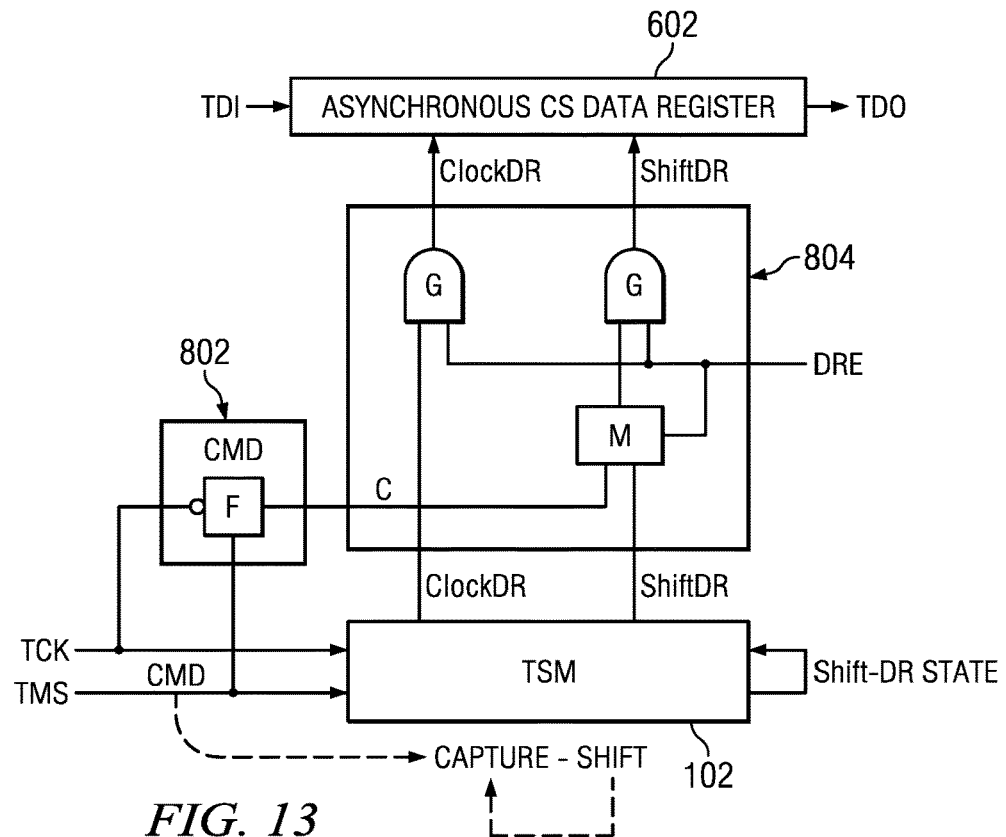
FIG. 13 illustrates an asynchronous CS data register being control by either the TSM or CMD circuit, via a Dual Port Router according to the disclosure.

FIG. 13 illustrates the asynchronous CS data register 602 of FIG. 6 connected to the TSM 102 and a CMD circuit 802 via a Dual Port Router 804. The Dual Port Router of this example consists of a multiplexer and gates connected as shown. The DRE inputs control the multiplexer and gates of the Dual Port Router to allow the data register to be accessed by the TSM as described in FIG. 6 or by the CMD circuit as described in FIG. 10. The first port of the Dual Port Router includes the ClockDR and ShiftDR outputs from the TSM.

The second port of the Dual Port Router includes the Capture (C) output from the CMD circuit and the ClockDR output from the TSM. The CMD circuit in this example is simply a FF that inputs the CMD signal from TMS on the falling edge of TCK. During access by the CMD circuit, the FF inputs the CMD signal from TMS and outputs a Capture (C) signal to the Dual Port Router which outputs a logic state on the ShiftDR signal, via the multiplexer and gate, to cause the data register to perform a Capture operation on the rising edge of ClockDR from the TSM. The ClockDR signal is active since the TSM is in the ShiftDR state. Following the Capture operation, the ShiftDR signal returns to it previous state to resume the Shift operation on the next rising edge of ClockDR. The Capture operation is repeated each time a CMD signal is input to the CMD circuit.

Figure 14:
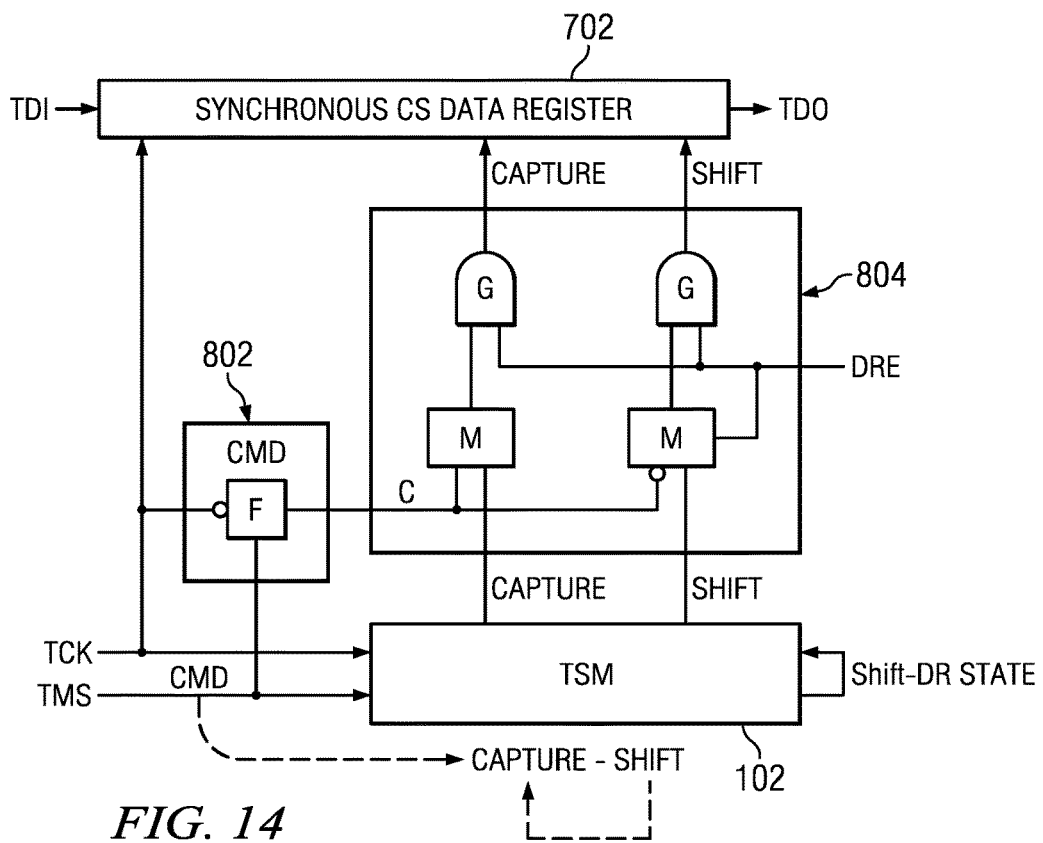
FIG. 14 illustrates a synchronous CS data register being control by the TSM or CMD circuit, via a Dual Port Router according to the disclosure.

FIG. 14 illustrates the synchronous CS data register 702 of FIG. 7 connected to the TSM 102 and the CMD circuit 802 of FIG. 12 via a Dual Port Router. The Dual Port Router of this example consists of multiplexers and gates connected as shown. The DRE inputs control the multiplexers and gates of the Dual Port Router to allow the data register to be accessed by the TSM as described in FIG. 7 or by the CMD circuit as described in FIG. 10. The first port of the Dual Port Router includes the Capture and Shift state outputs from the TSM. The second port of the Dual Port Router includes the Capture (C) output from the CMD circuit. The data register is clocked by the free running TCK signal. DRE inputs control the Dual Port Router to allow the data register to be accessed by the TSM as described in FIG. 7 or by the CMD circuit as described in FIG. 10. During access by the CMD circuit, the FF inputs the CMD signal from TMS and outputs a Capture (C) signal to the Dual Port Router which outputs which set the Capture and Shift inputs to the data register to states that cause the data register to perform a Capture operation on the rising edge of TCK. Following the Capture operation, the Capture and Shift signals return to their previous state to resume the Shift operation on the next rising edge of TCK. The Capture operation is repeated each time a CMD signal is input to the CMD circuit.

Figure 15:
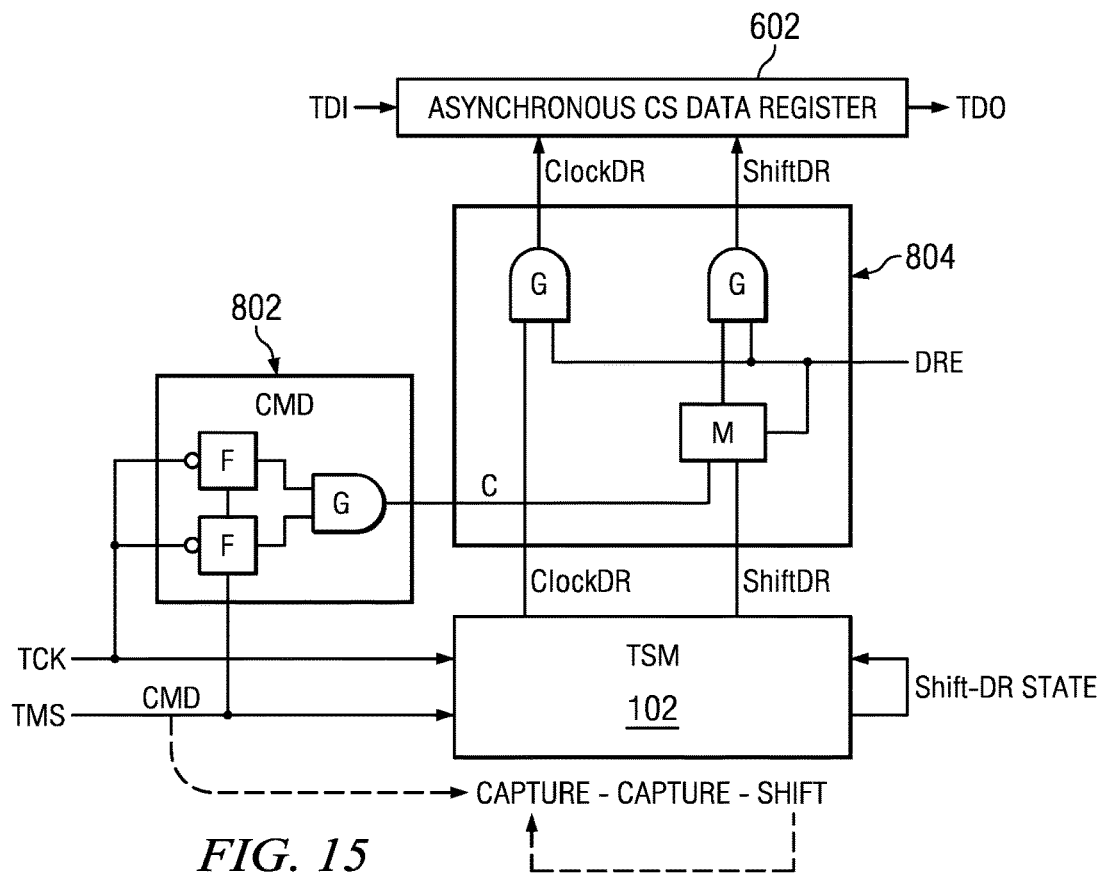
FIG. 15 illustrates an asynchronous CS data register being control by the TSM or CMD circuit, via a Dual Port Router according to the disclosure.

FIG. 15 illustrates the asynchronous CS data register 602 of FIG. 6 connected to the TSM 102 and a CMD circuit 802 via the Dual Port Router 804 of FIG. 13. As described in FIG. 13, DRE inputs control the Dual Port Router to allow the data register to be accessed by the TSM as described in FIG. 6 or by the CMD circuit. In this example, the CMD circuit is designed to control the data register to perform back to back Capture operations. The CMD circuit of this example consists of first and second serially connected FFs. The outputs of the FFs are input to a gate, such as a NOR gate. The output of the gate is input to the Dual Port Router. In response to a CMD input signal from TMS the first FF of the CMD circuit outputs a first Capture (C) signal then the CMD signal is shifted into the second FF of the CMD circuit which outputs a second Capture signal. The CMD circuit inputs both the first and second Capture signals (C) to the Dual Port Router, via the gate. In response to the first Capture (C) signal the Dual Port Router sets the ShiftDR input to the data register to a state to cause the data register to perform a first Capture operation on the rising edge of ClockDR. In response to the second Capture (C) signal the Dual Port Router maintains the capture state on the ShiftDR input to cause the data register to perform a second Capture operation on the next rising edge of ClockDR. Following the back to back Capture operations the ShiftDR input to the data register returns to its previous state to resume the Shift operation.

While FIGS. 8-15 illustrate various types of simple data registers being controlled by either the TSM or a CMD circuit, these data registers typically form the building blocks of more complex test architectures within devices. These more complex test architectures can also be controlled by the TSM or CMD circuit, as described in FIGS. 16-17 below.

Also while FIGS. 8-15 show the CMD circuit to be either a single flip flop or a serial arrangement of two flip flops, the CMD circuit may be designed in many different ways, including a CMD circuit designed as a state machine.

Figure 16:
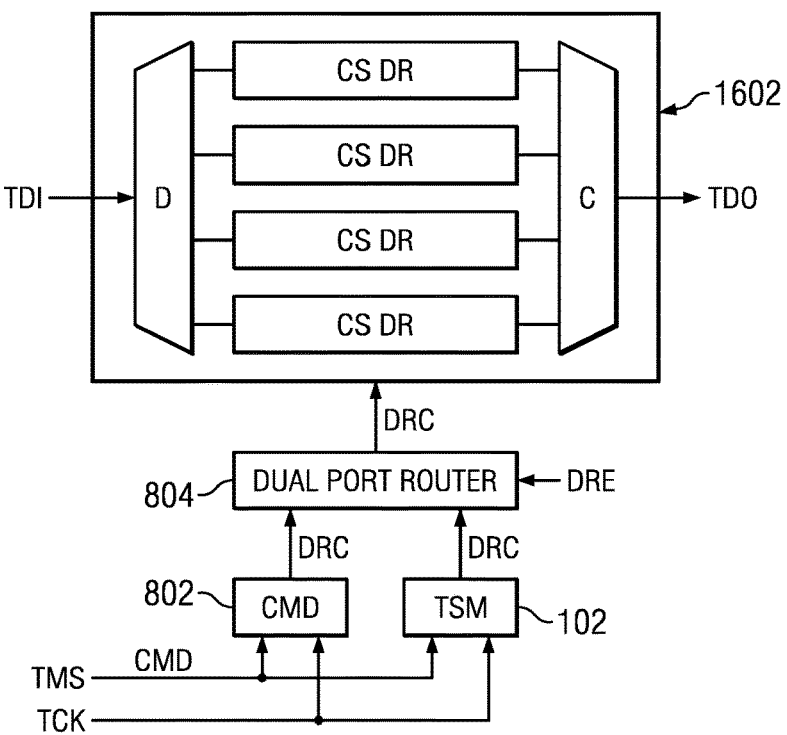
FIG. 16 illustrates a first test compression architecture being control by the TSM or CMD circuit, via a Dual Port Router according to the disclosure.

FIG. 16 illustrates a simple example of a known type of single input and single output test compression architecture 1602 within a device. The architecture consists of a Decompressor (D) circuit, parallel CS type Data Registers (DR), and a Compactor (C) circuit. The Decompressor is controlled by the DRC outputs of the Dual Port Router to input compressed stimulus data from TDI, decompress the stimulus data and output the decompressed stimulus data to the CS data registers. The Compactor is controlled by the DRC outputs of the Dual Port Router to input response data from the CS data registers, compact the response data and output the compacted response data on the TDO output. The CS data registers are controlled by the DRC outputs of the Dual Port Router to perform capture and shift operations. DRE inputs control the Dual Port Router to allow the test compression architecture to be controlled by the DRC outputs of the TSM like described in FIG. 6 or 7 or by the DRC outputs of the CMD circuit as described in FIGS. 13 and 14.

Figure 17:
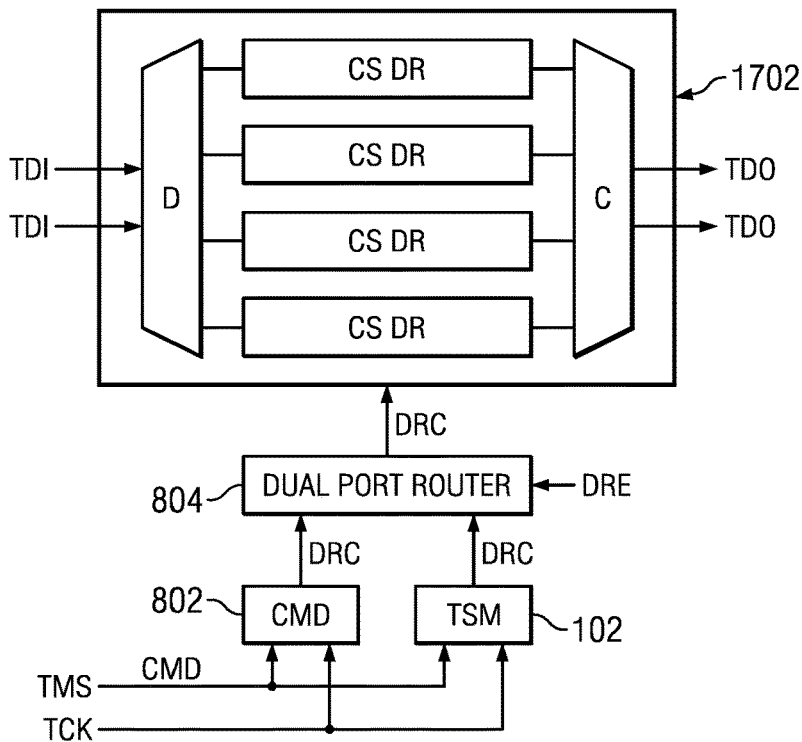
FIG. 17 illustrates a second test compression architecture being control by the TSM or CMD circuit, via a Dual Port Router according to the disclosure.

FIG. 17 illustrates a simple example of a known type of multiple input and multiple output test compression architecture 1702 within a device. The structure and operation of the architecture is the same as described in FIG. 16 with the exception that multiple TDI inputs are used to input the compressed stimulus data and multiple TDO output are used to output the compacted response data. The multiple input multiple output test compression architecture can be selectively controlled by either the TSM or the CMD circuit as described in FIG. 16.

Figure 18:
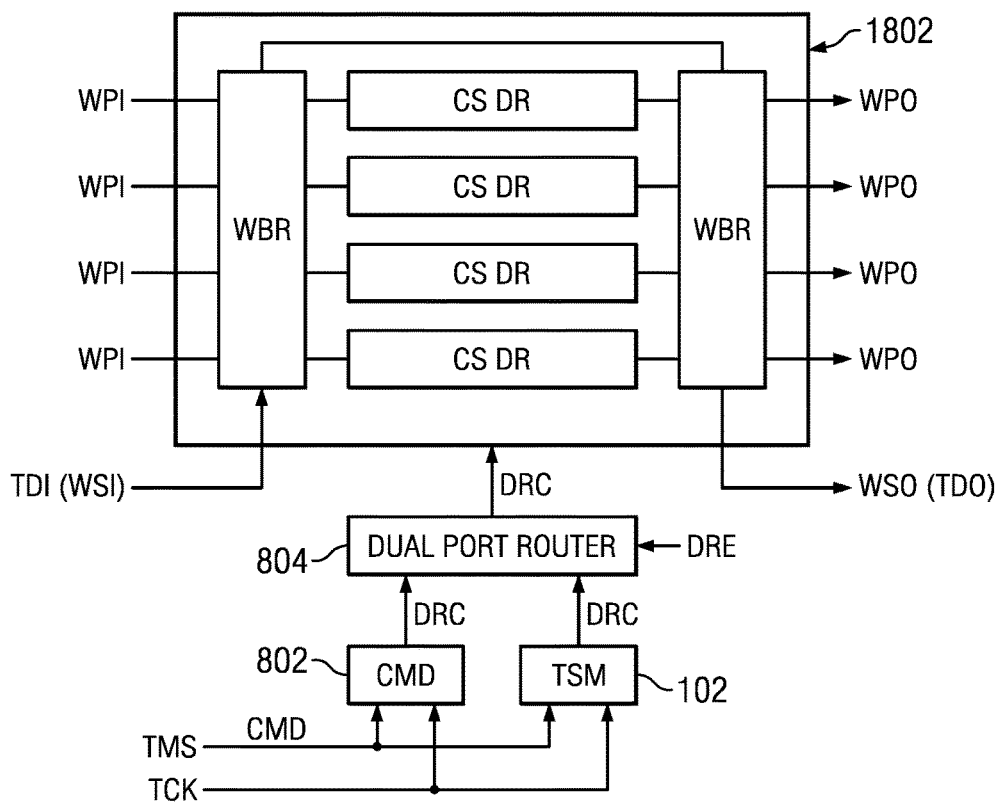
FIG. 18 illustrates an IEEE 1500 wrapper architecture being control by the TSM or CMD circuit, via a Dual Port Router according to the disclosure.

FIG. 18 illustrates a simple example of an IEEE 1500 core wrapper architecture 1802 within a device that is connected to the DRC outputs of a Dual Port Router. The architecture consists of a Wrapper Boundary Register (WBR) and parallel CS type Data Registers (DR). While not shown the architecture also includes an instruction register to control its test operation modes.

The wrapper boundary register is primarily used to provide interconnect testing between multiple core wrapper architectures in a device. It can be implemented as either a CSU or CS type data register. During interconnect testing, the wrapper boundary register is controlled by the DRC outputs of the Dual Port Router to shift data through the wrapper boundary register via the wrapper serial input (WSI) and wrapper serial output (WSO) and then perform an update and a capture operation. In this example the WSI is shown connected to TDI and the WSO is shown connected to TDO. If the TSM is selected by the DRE inputs to the Dual Port Router to control the interconnect test, the TSM will cycle through data register scanning states to output the DRC signals to control the wrapper boundary register. If the CMD circuit is selected by the DRE inputs to the Dual Port Router to control the interconnect test, the TSM will transition to and remain in the ShiftDR state while the CMD circuit outputs the DRC signals to control the wrapper boundary register.

The parallel CS data registers are used to perform parallel scan testing of the core's logic. During parallel scan testing the CS data registers are controlled by the DRC outputs of the Dual Port Router to shift data through the CS data registers via the wrapper parallel inputs (WPI) and wrapper parallel outputs (WPO) and then perform a capture operation. If the TSM is selected by the DRE inputs to the Dual Port Router to control the parallel scan test, the TSM will cycle through data register scanning states to output DRC signals to control the parallel CS data registers. If the CMD circuit is selected by the DRE inputs to the Dual Port Router to control the interconnect test, the TSM will transition to and remain in the ShiftDR state while the CMD circuit outputs DRC signals to control the parallel CS data registers.

Controlling the device test architectures shown in FIGS. 16-18 conventionally with the TSM will bring into play the problematic dead states during the scan operations. Controlling the test architectures with the CMD circuit advantageously eliminates these dead states during the scan operations.

While the examples of FIGS. 16-18 have shown how the CMD circuit and Dual Port Router may be used to improve scan or scan compression testing of a device, the CMD circuit may also be used to improve scan access to other types of embedded circuits in a device that are interfaced to a TAP. The following describes two such embedded circuits.

Figure 19:
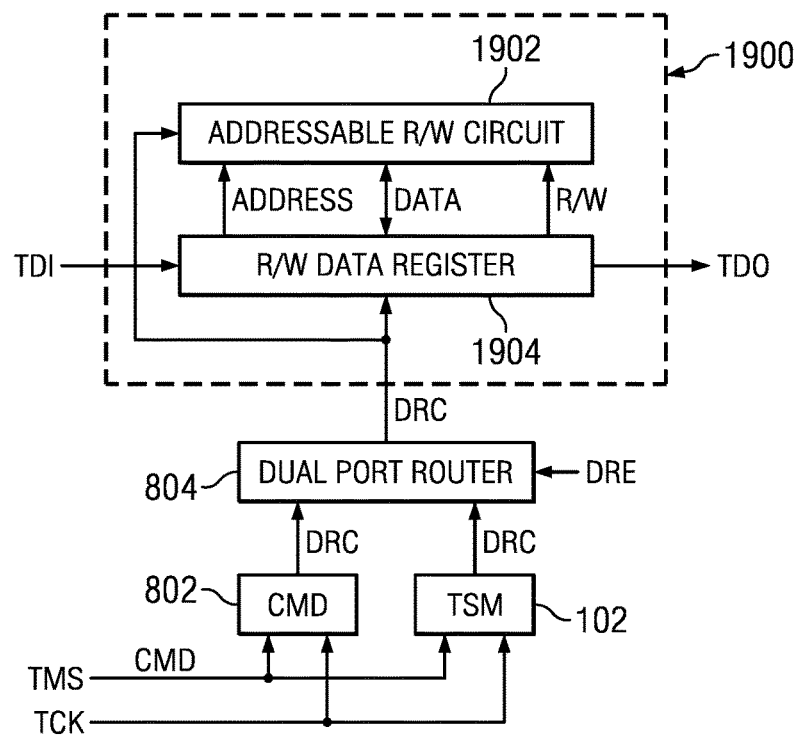
FIG. 19 illustrates a read/write circuit architecture being control by the TSM or CMD circuit, via a Dual Port Router according to the disclosure.

FIG. 19 illustrates an arrangement 1900 consisting of an addressable R/W circuit 1902 connected to a R/W data register 1904 that is selectively controlled by the TSM 102 or by a CMD circuit 802 via a Dual Port Router 804. The R/W circuit could be a memory, a test, a debug or a trace circuit. The R/W circuit receives address input and R/W control input from the data register to allow data to be written to and/or read from an addressed location in the R/W circuit via the data bus connection between the R/W circuit and the data register.

When TSM controlled access to the R/W circuit is desired, the DRE inputs control the Dual Port Router to connect the DRC outputs from the TSM to the DRC inputs of the data register. Once connected, the TSM transitions to the ShiftDR state to shift address, data and R/W control bits to and from the data register. If the R/W control bits are set for a write operation, the data in the data register is written to the addressed location of the R/W circuit when the TSM transitions to the UpdateDR state. If the R/W control bits are set for a read, the data in the addressed location of the R/W circuit is loaded into the data register when the TSM transitions to the CaptureDR state. If the R/W control bits are set for a read and write operation a read from addressed location of the R/W circuit occurs in the CaptureDR state and a write to the addressed location of the R/W circuit occurs in the UpdateDR state.

When CMD circuit controlled access to the R/W circuit is desired, the DRE inputs control the Dual Port Router to connect the DRC outputs of the CMD circuit to the DRC inputs of the data register. Once connected, the TSM transitions to and remains in the ShiftDR state to shift address, data and R/W control bits to and from the data register. At appropriate times during the shift operation, CMD inputs are input to the CMD circuit to cause the CMD circuit to output DRC signals to the Dual Port Router. If the R/W control bits are set for a write operation, the data in the data register is written to the addressed location in response to the CMD circuit's DRC signals. If the R/W control bits are set for a read operation, the data in the addressed location is loaded into the data register in response to the CMD circuit's DRC signals. If the R/W control bits are set for a read and write operation, the read and write occurs in response to the CMD circuit's DRC signals.

The advantage of the CMD circuit controlled R/W operations is that the TSM does not have to transition out of the ShiftDR state to the perform read and/or write operations. The read and/or write operations are performed by CMD inputs while the address, data and RW control bits are continuously shifted to and from the data register. If the data register is say 50 bits long, a read and/or a write operation can be commanded to occur following every 50th shift operation.

Figure 20:
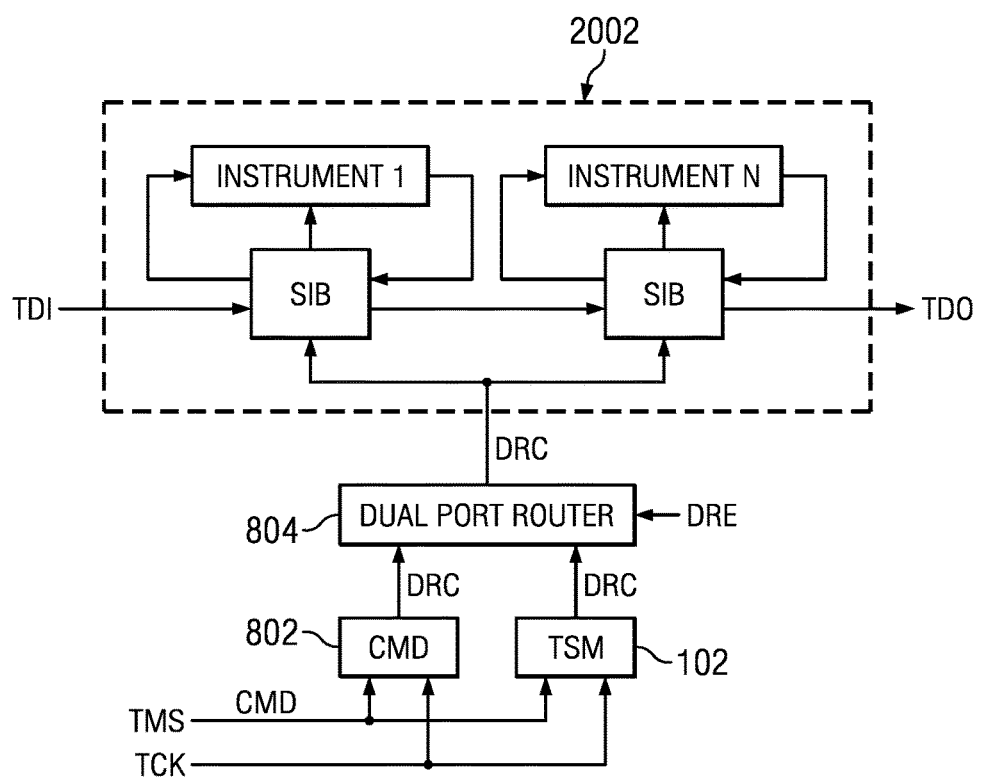
FIG. 20 illustrates an IEEE P1687 instrumentation architecture being control by the TSM or CMD circuit, via a Dual Port Router according to the disclosure.

FIG. 20 illustrates an instrumentation data register architecture 2002 being developed by IEEE standard P1687 for accessing embedded instruments in a device. The instrumentation data register architecture consists of segment insertion bit (SIB) elements that can be controlled by scan operations to connect or disconnect an instrument in the path between TDI and TDO. The instrumentation data register architecture mimics the operation of a self-controlled variable length scan path first described by Whetsel in U.S. Pat. No. 4,872,169. The instrumentation data register architecture is being specified to include DRC control inputs to allow it to be connected to and controlled by the DRC outputs from a TSM. In this example, a CMD circuit and Dual Port Router have been added to illustrate how the instrumentation data register may also be controlled by a CMD circuit.

When TSM controlled access to the instrumentation data register is desired, the DRE inputs control the Dual Port Router to connect the DRC outputs from the TSM to the DRC inputs of the data register. Once connected, the TSM transitions to the ShiftDR state to shift data to and from the instrumentation data register. If a SIB is set to connect its associated instrument into the data register, data can be written to the instrument in the UpdateDR state and read from the instrument in the CaptureDR state in the same manner as described for the R/W circuit of FIG. 19.

When CMD circuit controlled access to the instrumentation data register is desired, the DRE inputs control the Dual Port Router to connect the DRC outputs of the CMD circuit to the DRC inputs of the data register. Once connected, the TSM transitions to the ShiftDR state to shift data to and from the data register. If a SIB is set to connect its associated instrument into the data register, data can be written to the instrument and read from the instrument in response to a CMD input to the CMD circuit in the same manner as described for the R/W circuit of FIG. 19.

The advantage of the CMD circuit controlled instrument access operations is the same as the CMD circuit controlled R/W circuit access operations, that being the TSM does not have to transition out of the ShiftDR state to the perform read and/or write operations since they are performed by the CMD inputs while data continuously shifts in and out of the instrumentation data register.

Improving Board Level Test Operations

Figure 21:
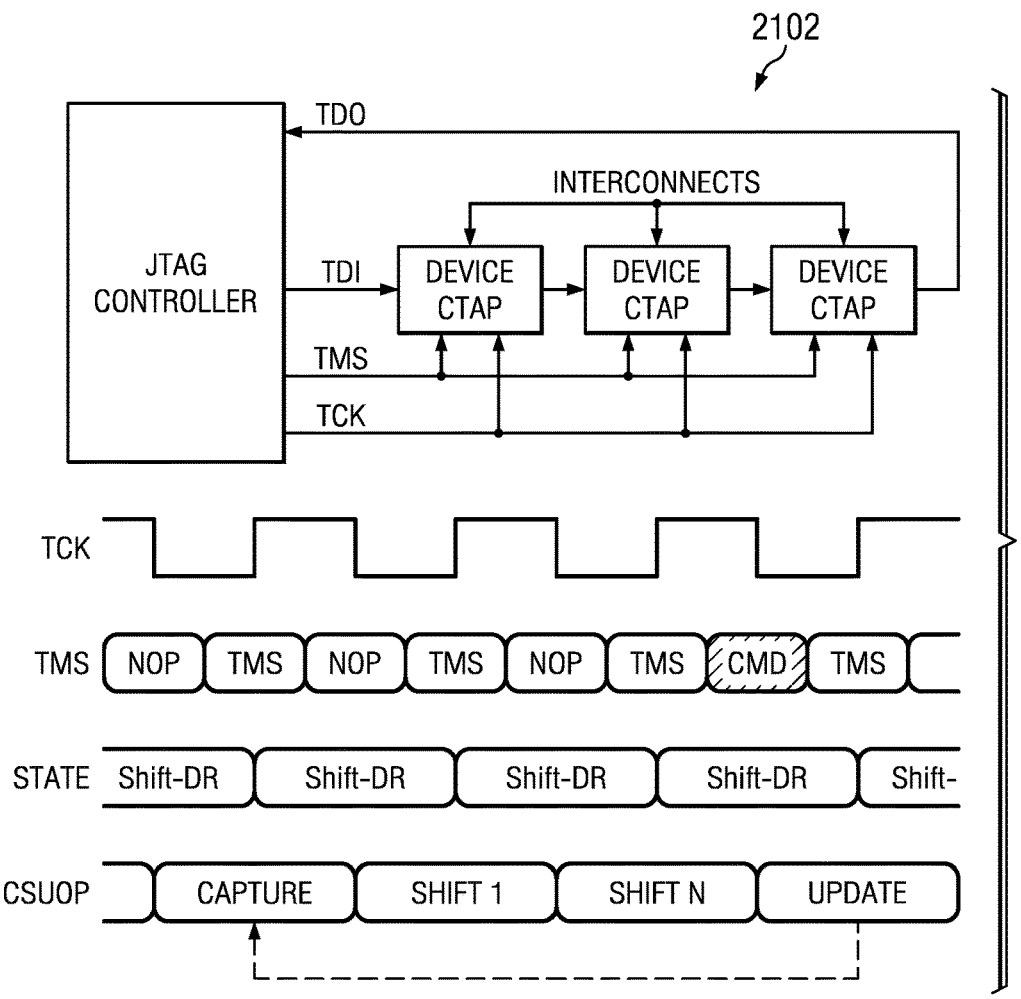
FIG. 21 illustrates a first daisy-chain of devices performing an external test operation according to the disclosure.

FIG. 21 illustrates an arrangement 2102 of daisy-chained devices connected to a JTAG controller. The devices may be ICs on a board or embedded circuits in an IC. Each device has a Commandable TAP (CTAP), i.e. each device TAP includes the CMD circuit and Dual Port Router of this disclosure. In this example the device CTAPs have been loaded with a CMD controlled IEEE 1149.1 Extest boundary scan instruction to enable at-speed update and capture operations across the interconnects. As seen in the timing diagram, the Update, Capture and Shift boundary scan test operations are performed in response to CMD inputs from TMS, as previously described. In this example the Update operation occurs on the rising edge of TCK and the Capture operation occurs on the following rising edge of TCK. This provides an Extest boundary scan update and capture operation that occurs within one TCK period, versus the two and one half TCK periods of a conventional Extest boundary scan update and capture operation.

If desired, the Update operation could be delayed, by design of the Dual Port Router, to where it occurs on the falling edge of TCK and the Capture operation occurs on the following rising edge of TCK, placing only a one half TCK period between update and capture. This timing tightening between Update and Capture operations can be applied to any type of CSU data register.

During the at-speed boundary scan test, normal TMS signals are input on the rising edge of TCK to maintain the CTAPs in the ShiftDR state. The CTAPs can also be set to perform conventional Extest boundary scan testing of the interconnects using TSM state transitions. However, the test will not be an at-speed Update and Capture test since the TSM dead states will be introduced.

IEEE standard 1149.6 was developed to provide a boundary scan test capable of testing AC coupled interconnects between devices. 1149.6 was needed because the 1149.1 Extest instruction could not adequately test all AC coupled interconnects due to the 2 and a half TCK delay between the Update and Capture operation. Since the CMD controlled Extest operation described above can update and capture data across the interconnects within one or even one half a TCK period, it enables testing of AC coupled interconnects that are resistant to testing using the normal 1149.1 Extest instruction.

Figure 22:
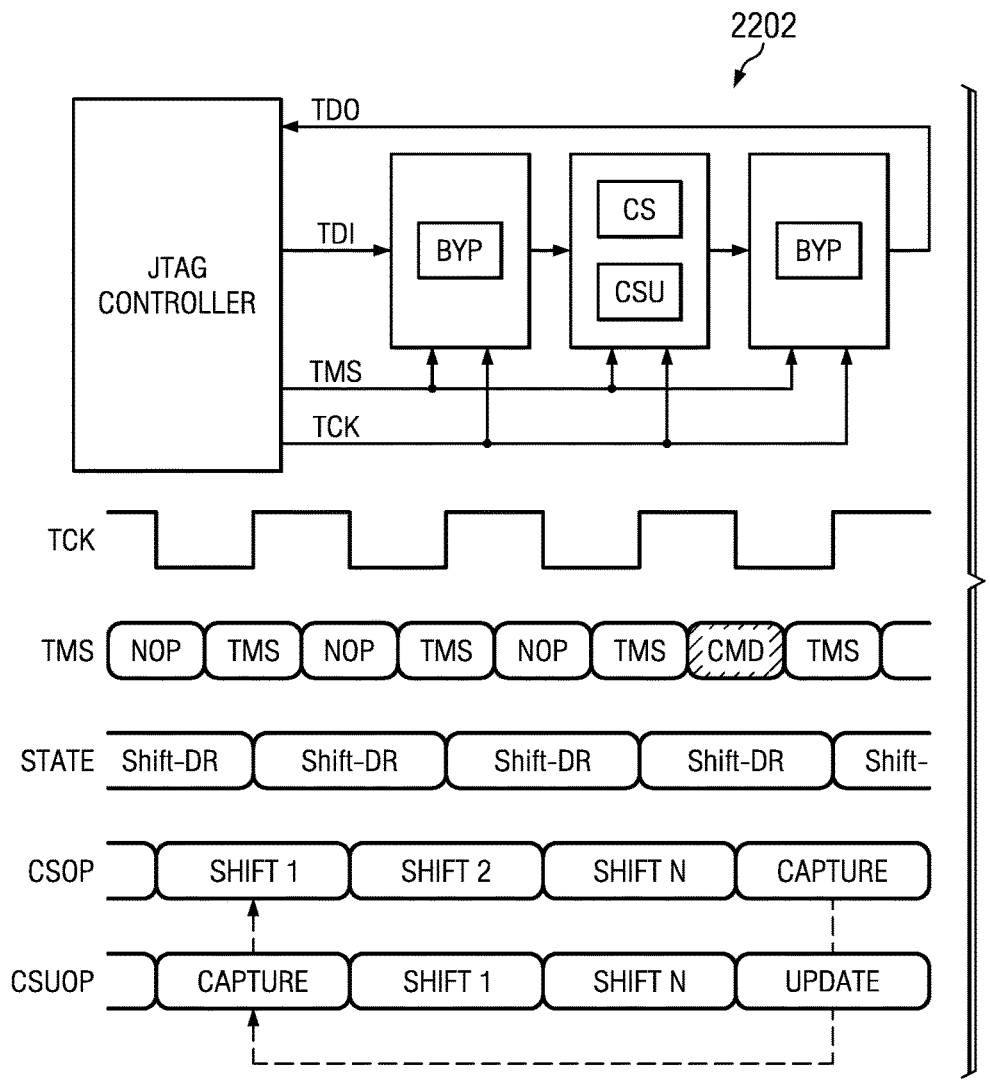
FIG. 22 illustrates a second daisy-chain of devices performing an internal test operation according to the disclosure.

FIG. 22 illustrates an arrangement 2202 of daisy-chained devices connected to a JTAG controller. The devices may be ICs on a board or embedded circuits in an IC. In this example, it is desired to access a CS or CSU type circuit residing in the middle device. The CS or CSU circuit may be any of the types previously described that communicate data using only TDI and TDO. To setup the access to the middle device, the leading and trailing devices are loaded with an IEEE 1149.1 instruction, i.e. an 1149.1 Bypass, Clamp or HighZ instruction, that selects their Bypass (BYP) register and the middle device is loaded with an instruction to select a desired CS or CSU type circuit for access.

If the access to the CS or CSU circuit of the middle device is to be performed using normal JTAG scan operations, the instruction loaded into the middle device will connect the device's TSM to the CS or CSU circuit. Access to the middle device circuit is performed by the JTAG controller executing conventional data register Capture, Shift and Update operations. During a Capture operation the Bypass registers compliantly load logic zeros and the middle device circuit loads data to be output to the controller during the next Shift operation. Following a Shift operation, an Update operation is performed to update data that has been shifted into the middle circuit, assuming it's a CSU type circuit. During each data register scan operation the JTAG controller must shift data through the Bypass registers of the leading devices, through the middle device circuit and through the Bypass registers of the trailing devices. If there are 50 leading devices, 50 trailing devices and the middle device circuit scan length is 50 bits, each data register scan cycle will be 150 bits long. If a large number of scan cycles are required to access the middle device circuit, a considerable amount time may be wasted by having to repeatedly shift data through the leading and trailing device Bypass registers.

If the access the CS or CSU circuit of the middle device is to be performed using the CMD circuit, meaning the TAP of the middle circuit will be augmented with the CMD circuit and Dual Port Router of this disclosure, the instruction loaded into the middle device will connect the device's CMD circuit to the CS or CSU circuit. Access to the middle device circuit is performed by the JTAG controller placing all devices in the ShiftDR state to continuously shift data though the devices from TDI to TDO. At appropriate times during the shifting the JTAG controller inputs CMD signals to the CMD circuit of the middle device, via the TMS signal. In response to the CMD inputs, CS circuits will perform a Capture operation and then resume shifting data, as seen in the CSOP timing of FIG. 22. In response to the CMD inputs, CSU circuits will perform an Update operation followed by a Capture operation and then resume shifting data, as seen in the CSUOP timing of FIG. 22. Since the Bypass registers of the leading and trailing devices do not respond to the CMD inputs, they simply operate as pipeline bits shifting data from the JTAG controller to the middle device and from the middle device back to the JTAG controller.

During access to the middle device, the only time wasted having to traverse the Bypass registers is once at the beginning of the access when data from the JTAG controller fills the leading device Bypass registers and once at the end of the access when data from the middle device is emptied to the JTAG controller from the trailing device Bypass registers. Reusing the example 50 leading devices, 50 trailing devices, and a 50 bit middle device circuit length, the access to the middle device is only lengthened by a one time 50 bit shift at the beginning of the access and a one time 50 bit shift at the ending of the access.

Adapting JTAG Controllers for CMD Outputs

The approach of this disclosure to input CMDs using the TMS signal requires modification of legacy JTAG controllers. There are two basic types of JTAG controllers, software controlled JTAG controllers and hardware controlled JTAG controllers. Software controlled JTAG controllers simply use a computers parallel port to operate the TMS, TCK, TDI and TDO signals using software. Hardware controlled JTAG controllers use a JTAG interface circuit to control the TMS, TCK, TDI and TDO signals. Adapting software controlled JTAG controllers to provide the CMD signals on TMS is achieved by simply modifying the software that controls the parallel port. Adapting hardware controlled JTAG controllers to provide the CMD signals on TMS is more difficult since it requires modifying the hardware. The following describes a simple way to modify hardware controlled JTAG controllers to provide the CMD signals on TMS.

Figure 23:
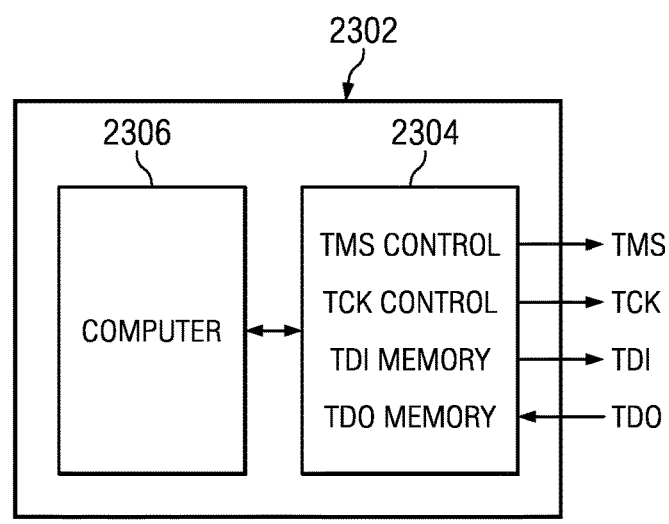
FIG. 23 illustrates a JTAG/1149.1 bus controller

FIG. 23 illustrates an example hardware controlled JTAG controller 2302 which consists of a computer 2306 and a JTAG interface circuit 2304. The JTAG interface circuit has a TMS control circuit for outputting TMS signals, a TCK control circuit for outputting TCK signals, a TDI memory for outputting TDI signals and a TDO memory for inputting TDO signals. The computer performs reads and writes to the JTAG interface circuit to cause the JTAG interface circuit to operate the TMS, TCK, TDI and TDO signals.

Figure 24:
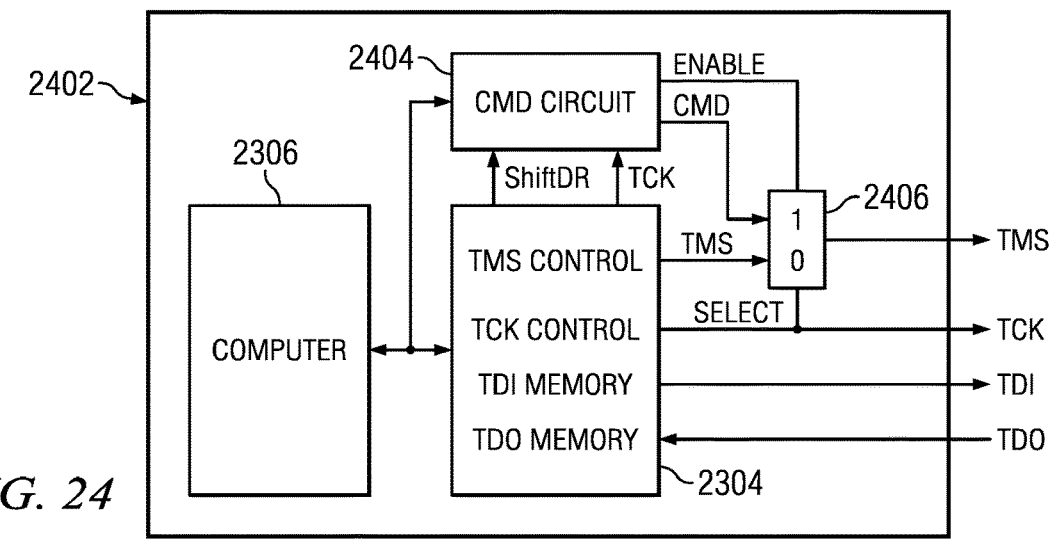
FIG. 24 illustrates a JTAG/1149.1 bus controlled augmented with a CMD circuit according to the disclosure

FIG. 24 illustrates an example arrangement 2402 showing how the JTAG controller of FIG. 23 could be augmented with a CMD circuit 2404 and a multiplexer 2406 to selectively allow it to provide or not provide the CMD signals on TMS. The CMD circuit has a computer interface, a ShiftDR state input, a TCK input, an Enable output and a CMD output. The TCK input times the CMD circuit and the ShiftDR state input enables the operation of the CMD circuit. The multiplexer has an enable input connected to the Enable output, a data input connected to the CMD output, a data input connected to the TMS output, a Select input connected to the TCK output and an output connected to the TMS output. When the JTAG controller arrangement 2402 is set to not provide the CMD signal on TMS, the Enable signal will be set to cause the multiplexer to only output the TMS signal, duplicating the operation of the legacy JTAG controller of FIG. 23. When the JTAG controller arrangement 2402 is set to provide the CMD signals on TMS, the Enable signal will be set to cause the multiplexer to alternate between outputting the TMS signal and the CMD signal in response to the Select input from the TCK signal.

Figure 25:
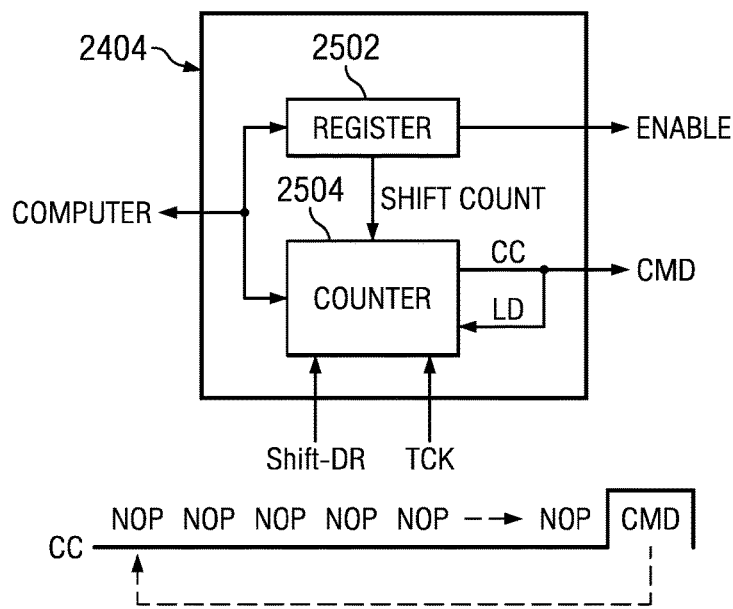
FIG. 25 illustrates an example implementation of the JTAG Controller CMD circuit according to the disclosure.

FIG. 25 illustrates an example implementation of the CMD circuit 2404 of FIG. 24 consisting of a Register 2502 and Counter 2504. The Register contains a Shift Count bit field and the Enable bit. When the JTAG controller arrangement of FIG. 24 is to perform normal JTAG operations, the computer sets the Enable bit to cause the multiplexer to only output TMS signals. When the JTAG controller arrangement 2402 is to perform CMD operations, the computer writes a Shift Count to the Register, sets the Enable bit to cause the multiplexer to alternately output TMS and CMD signals in response to the Select signal and loads the Shift Count into the Counter. The Shift Count is set equal to the bit length of the data register being accessed. During CMD'ed operations, the ShiftDR state input is set to enable the Counter to count once per rising edge TCK shift operation. When the Shift Count expires, the Counter outputs a Count Complete (CC) signal which sets the CMD signal high. The CMD signal is output on TMS, via the multiplexer, to trigger a CMD'ed operation in a target device. As seen in the timing diagram of FIG. 25, NOP signals are output on TMS until the CMD signal occurs. The CC signal also Loads (LD) the Shift Count into the Counter for the next CMD'ed shift cycle. The operation repeats until the test is complete. When in the CMD signal output mode, the JTAG controller arrangement 2402 of FIG. 24 provides a one half TCK setup time for the TMS signal prior to the rising TCK edge and a one half TCK setup time for the CMD signal prior to the falling TCK edge.

Figure 26:
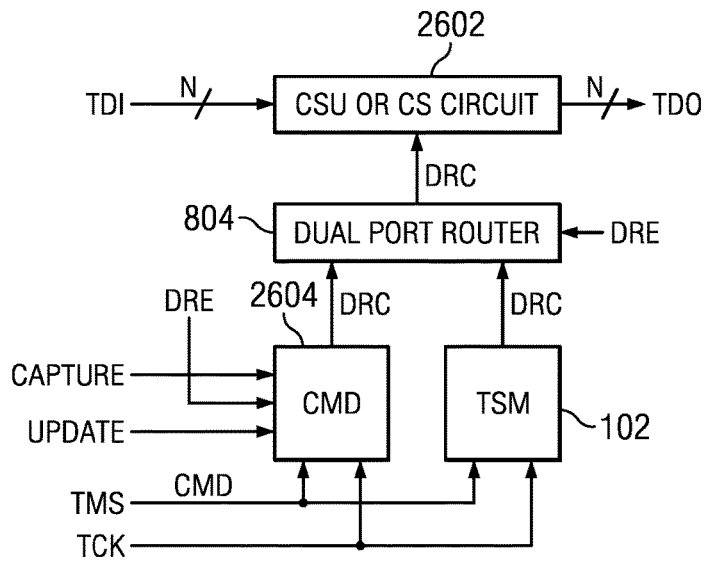
FIG. 26 Illustrates a CSU or CS circuit connectable to a TSM or CMD circuit with additional Capture and Update inputs via a Dual Port Router according to the disclosure.

FIG. 26 illustrates a circuit block 2602 containing one or more CSU and/or CS data register elements. Circuit block 2602 could be any type of circuit including but not limited to a test circuit, a debug circuit, a trace circuit, an emulation circuit, read/write circuit and an instrumentation circuit. Some examples of such circuits were described in regard to FIGS. 16-20. The circuit block is controlled by the DRC outputs of a Dual Port Router 804 to perform Capture and Shift or Capture, Shift and Update operations. DRE inputs control the Dual Port Router to allow the circuit block 2602 to be controlled by the DRC outputs of the TSM 102 or CMD circuit 2604 as previously described. The CMD circuit 2604 of this example has additional inputs for a Capture signal and an Update signal. In response to DRE inputs, the Capture and Update signals can be selected to control the DRC outputs of the CMD circuit 2604. During device manufacturing test at wafer or package level, it may be desirable to allow an external tester to directly control the DRC outputs of the CMD circuit using the Capture and Update signals, which are made accessible on device leads during test. Allowing a tester to control the DRC outputs of the CMD circuit, via the Capture and Update signals, enables more flexible control of the CMD circuit's DRC outputs. Also it allows the TMS input to the TSM to only have to input the TMS signal, not the TMS and CMD signal which simplifies the testers interface to the TAP 102. Further, only having to input the TMS signal on the TMS input can enable the TCK to run at faster clock frequencies since better setup and hold times can be applied on the TMS signal. During test using the Capture and Update signals, the tester will transition the TAP to the ShiftDR state to shift data to and from circuit block 2602 via the TDI and TDO signals and at appropriate times during the shifting operate the Capture and Update signals to effectuate testing circuit block 2602.

Figure 27:
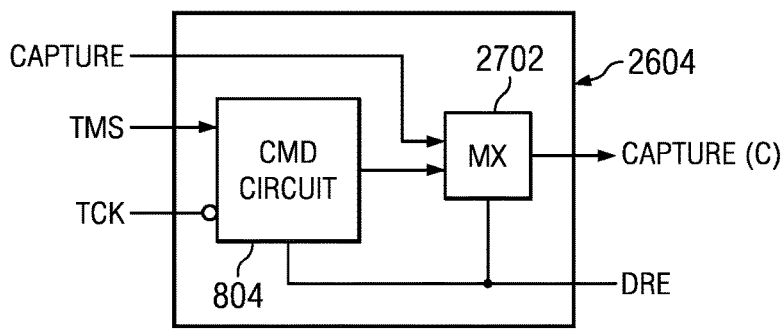
FIG. 27 illustrates a CMD circuit with a Capture input according to the disclosure.

FIG. 27 illustrates one example implementation of CMD circuit 2604 which consists of the previously described CMD circuit 804 of FIGS. 13 and 14 and a multiplexer 2702. When the CMD circuit 2604 is set to allow the CMD circuit 804 to control the Capture (C) output, DRE input will set the multiplexer to couple the Capture (C) output to the output of the CMD circuit 804 to allow the at speed Shift & Capture operation as described in FIGS. 13 and 14. When the CMD circuit 2604 is set to allow the Capture signal to control the Capture (C) output, DRE input will set the multiplexer to couple the Capture signal to the Capture (C) output to allow a tester to directly control the at-speed Shift & Capture operation. CMD circuit 804 control of the Capture (C) output will advantageously be used when the device is in a system with other devices such as seen in FIGS. 21 and 22. Capture signal control of the Capture (C) output will advantageously be used when the device is being tested by a tester at wafer or package level device test.

Figure 28:
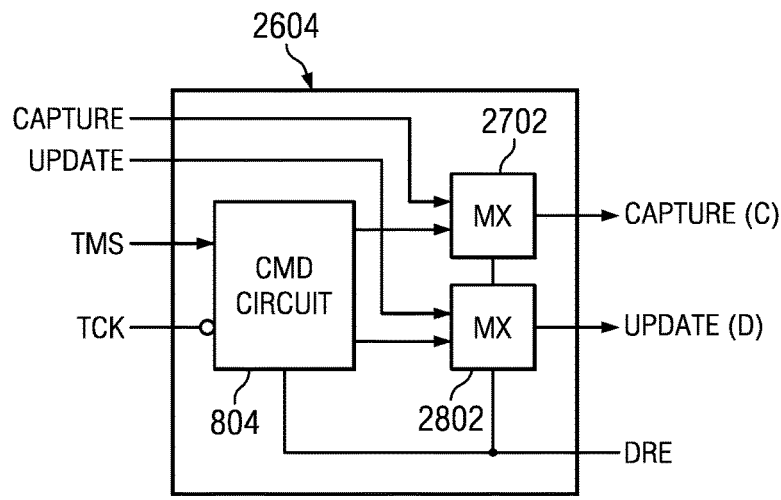
FIG. 28 illustrates a CMD circuit with Capture and Update inputs according to the disclosure.

FIG. 28 illustrates another example implementation of CMD circuit 2604 which consists of the previously described CMD circuit 804 of FIGS. 11 and 12 and multiplexers 2702 and 2802. When the CMD circuit 2604 is set to allow the CMD circuit 804 to control the Update (U) and Capture (C) outputs, DRE input will set the multiplexer to couple the Update (U) and Capture (C) outputs to the outputs of the CMD circuit 804 to allow the at speed Update & Capture and Shift & Capture operations as described in FIGS. 11 and 12. When the CMD circuit 2604 is set to allow the Update and Capture signals to control the Update (U) and Capture (C) outputs, DRE input will set the multiplexer to couple the Update and Capture signals to the Update (U) and Capture (C) outputs to allow a tester to directly control the at-speed Update & Capture and Shift & Capture operations. CMD circuit 804 control of the Update (U) and Capture (C) outputs will advantageously be used when the device is in a system with other devices such as seen in FIGS. 21 and 22. Update and Capture signal control of the Update (U) and Capture (C) outputs will advantageously be used when the device is being tested by a tester at wafer or package level device test.

Figure 29B:
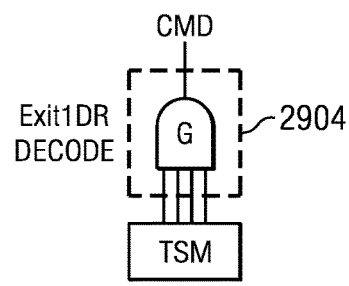
FIG. 29B illustrates gating circuitry for outputting a CMD signal to the CMD circuit when the TSM is in the Exit1DR state according to the disclosure.
Figure 29A:
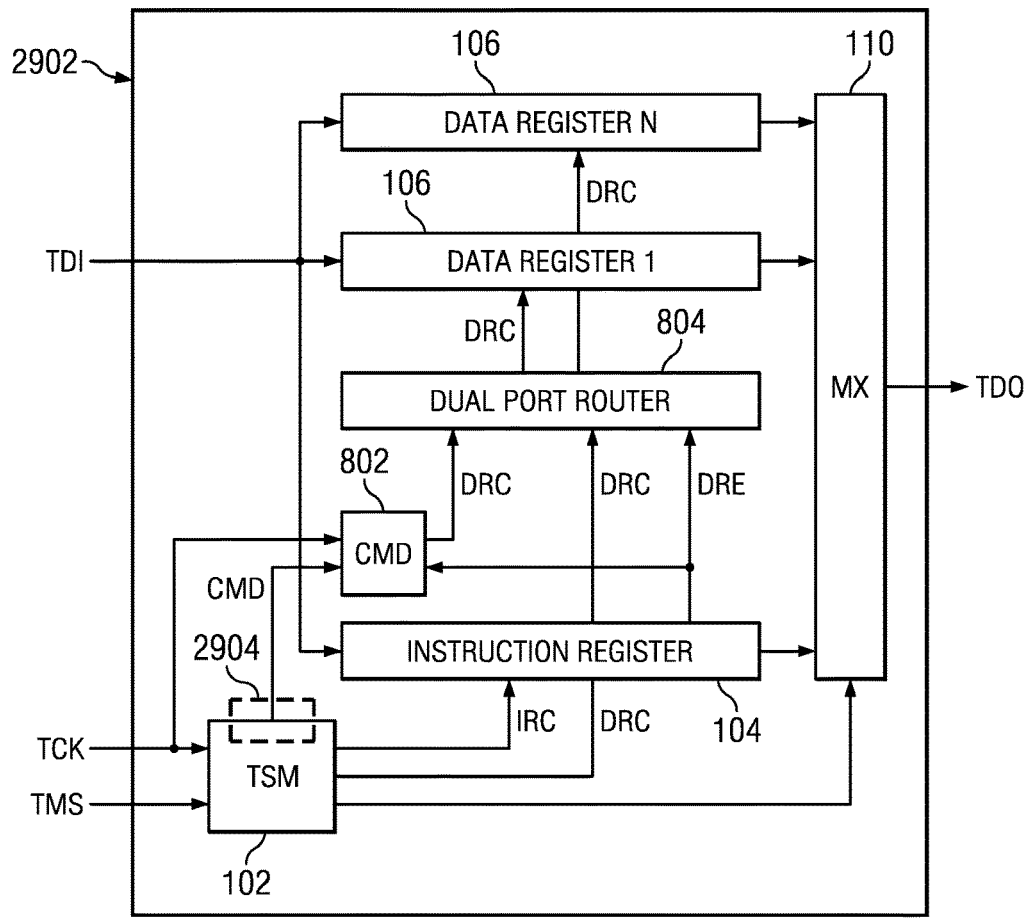
FIG. 29A illustrates an IEEE 1149.1 TAP augmented with a CMD circuit that receives CMD signal from the TSM according to the disclosure.

FIG. 29A illustrates a TAP 2902 that is identical to TAP 800 of FIG. 8 with the exception that the CMD input to CMD circuit 802 comes from an output 2904 of the TSM 102 instead of from the TMS input. The CMD output 2904 from the TSM occurs when the TSM is in the Exit1DR state. This is achieved by using a state decode gate to detect when the TSM is in the Exit1DR state as shown in FIG. 29B.

Figure 30:
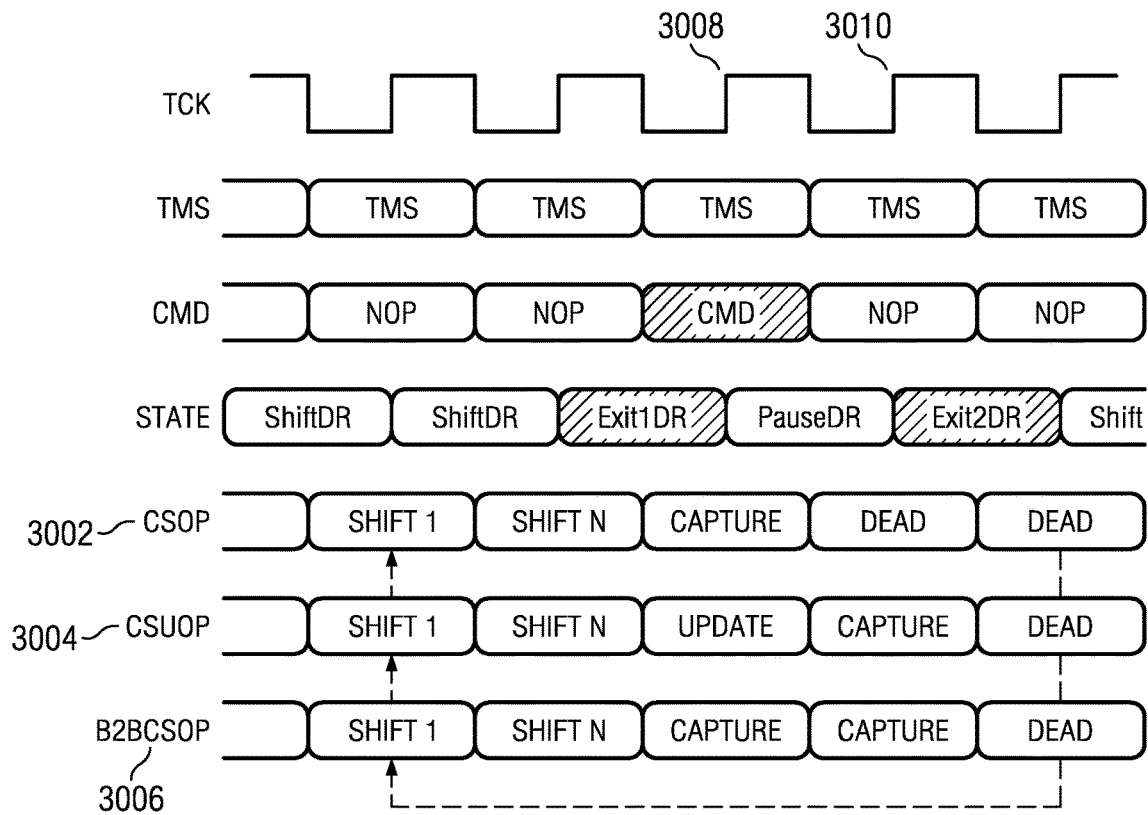
FIG. 30 illustrates a timing diagram of the TSM outputting CMD signals to the CMD circuit to perform CSOP, CSUOP and B2BCSOP operations according to the disclosure.

FIG. 30 illustrates the timing diagram of the TSM transitioning through the Exit1DR state (shaded) to output the CMD signal to the CMD circuit of FIG. 29A. As seen, the CMD circuit registers the CMD signal (shaded) from the falling edge of TCK to the next falling edge of TCK as described with the CMD circuit of FIG. 8. The CMD operation occurs on the rising edge 3008 of TCK between the two falling edges of TCK. If the CMD operation performs a Capture and Shift operation (CSOP) 3002 using the example CMD circuit 802 of FIGS. 13 and 14, the Capture occurs on the rising edge of TCK 3008. If the CMD operation performs a Capture, Shift and Update operation (CSUOP) 3004 using the example CMD circuit 802 of FIG. 11 or 12, the Update operation occurs on the rising edge of TCK 3008 and the Capture operation occurs on the next rising edge of TCK 3010. If the CMD operation performs a Back to Back Capture and Shift operation (B2BCSOP) 3006 using the example CMD circuit 802 of FIG. 15, the first Capture operation occurs on the rising edge of TCK 3008 and the second Capture operation occurs on the next rising edge of TCK 3010.

As seen in the timing diagram of FIG. 30, and unlike the timing diagram of FIG. 10, the TSM must transition out of the ShiftDR state to pass through the Exit1DR state to provide the CMD signal to CMD circuit 802. For CSOPs 3002, this means that two dead states (i.e. no action states) PauseDR and Exit2DR must be traversed before resuming the ShiftDR state following the Capture operation. For CSUOPs 3004, this means that one dead state Exit2DR must be traversed before resuming the ShiftDR state following the Update and Capture operations. For B2BCSOPs 3006, this means that one dead state Exit2DR must be traversed before resuming the ShiftDR state following the first and second Capture operations. While dead states are introduced using the Exit1DR state to detect the CMD signal, the dead states occur after the desired at-speed Shift and Capture operations (CSOP) 3002, at-speed Update and Capture operations (CSUOP) 3004 and at speed Back to Back Capture operations (B2BCSOP) 3006.

It is known that when the TSM 102 transitions from the ShiftDR state, it ceases or gates off the outputting of clock signals on its ClockDR output. As seen in the timing diagram of FIG. 30, the CSOP operation 3002 requires a clock in the Exit1DR state for the Capture operation, the CSUOP operation 3004 requires a clock in the Exit1DR and PauseDR states for the Update and Capture operations and the B2BCSOP operation 3006 requires a clock in the Exit1DR and PauseDR states for the Back to Back Capture operations. The following description of FIGS. 31 and 32 will illustrate an example of how to provide these clocks on ClockDR during these states.

Figure 31:
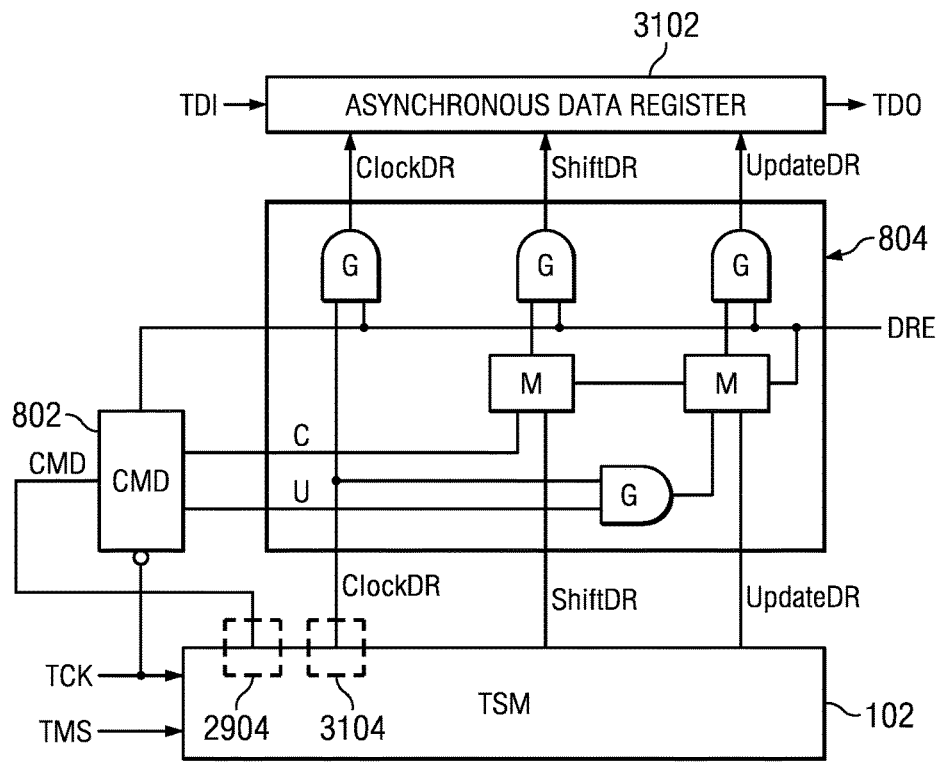
FIG. 31 illustrates a data register being controlled by a CMD circuit that receives CMD signals for the TSM according to the disclosure.

FIG. 31 illustrates an asynchronous register 3102, Dual Port Router 804, CMD circuit 802 and TSM 102. Asynchronous data register 3102 could be an asynchronous CSU data register 402 or an asynchronous CS data register 602. If it is an asynchronous CSU data register 402 the CMD circuit 802 will operate as described in FIG. 11 to provide the ClockDR, ShiftDR and Update signals to the data register via the Dual Port Router 804. If it is an asynchronous CS data register 602 the CMD circuit 802 will operate as described in either FIG. 13 or FIG. 15 to provide the ClockDR and ShiftDR signals to the data register via the Dual Port Router 804. The only difference between the arrangement of FIG. 31 and other previously described arrangements using CMD circuits 802 is that the CMD signal to the CMD circuit of FIG. 31 comes from the TSM instead of from the TMS signal. The TSM includes the gating circuit 2904 of FIG. 29B to provide the CMD signal during the Exit1DR state and further ClockDR gating circuitry 3102 to provide clock signals on ClockDR as described above for the CSOP, CSUOP and B2BCSOP operations.

Figure 32:
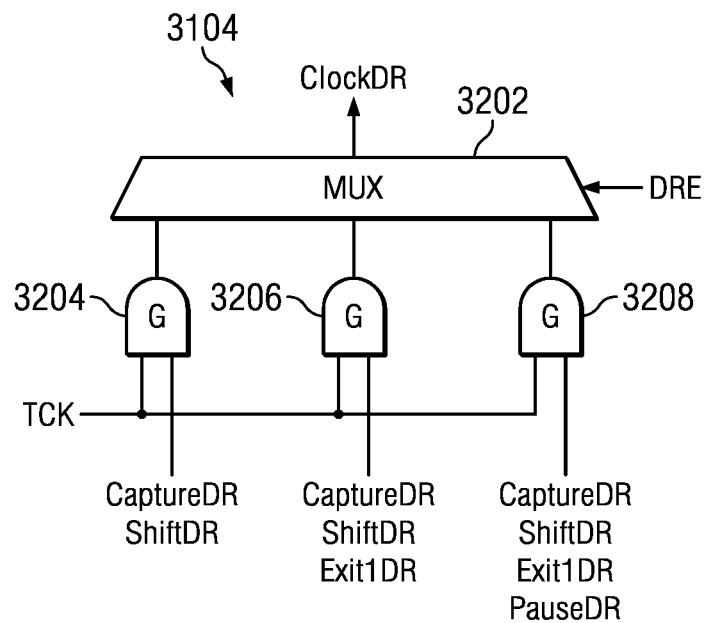
FIG. 32 illustrates a circuit for producing clock signals on the TSM's ClockDR output during certain TSM states according to the disclosure.

FIG. 32 illustrates an example of the TSM's ClockDR gating circuitry 3102 which includes gating circuits 3204-3208 and a multiplexer 3202, all connected as shown. Each gating circuit 3204-3208 inputs the TCK signal and four state signals indicative of the TSM state. Gating circuitry 3204 passes TCK to the multiplexer when the TSM is in the CaptureDR or ShiftDR state. Gating circuitry 3206 passes TCK to the multiplexer when the TSM is in the CaptureDR, ShiftDR or Exit1DR state. Gating circuitry 3208 passes TCK to the multiplexer when the TSM is in the CaptureDR, ShiftDR, Exit1DR or PauseDR state. The multiplexer receives DRE input from the instruction register to select which gating circuit output to pass on to the ClockDR output.

When the TSM is controlling the DRC signals to the data register 3102, the output of gating circuit 3204 will be multiplexed to the ClockDR output of multiplexer 3202 to allow conventional IEEE 1149.1 TSM controlled Capture and Shift or Capture, Shift and Update operations. When the CMD circuit is controlling the DRC signals to the data register 3102 during CSOP operations 3002 of FIG. 30, the output of gating circuitry 3206 will be multiplexed to the ClockDR output of multiplexer 3202 to provide the required additional Capture clock on ClockDR during the Exit1DR state. When the CMD circuit is controlling the DRC signals to the data register 3102 during CSUOP operations 3004 of FIG. 30, the output of gating circuitry 3208 will be multiplexed to the ClockDR output of multiplexer 3202 to provide the required additional Update clock on ClockDR during the Exit1DR state and the required Capture clock on ClockDR during the PauseDR state. When the CMD circuit is controlling the DRC signals to the data register 3102 during B2BCSOP operations 3006 of FIG. 30, the output of gating circuitry 3208 will be multiplexed to the ClockDR output of multiplexer 3202 to provide the required additional first Capture clock on ClockDR during the Exit1DR state and the required additional second Capture clock on ClockDR during the PauseDR state.

Figure 33:
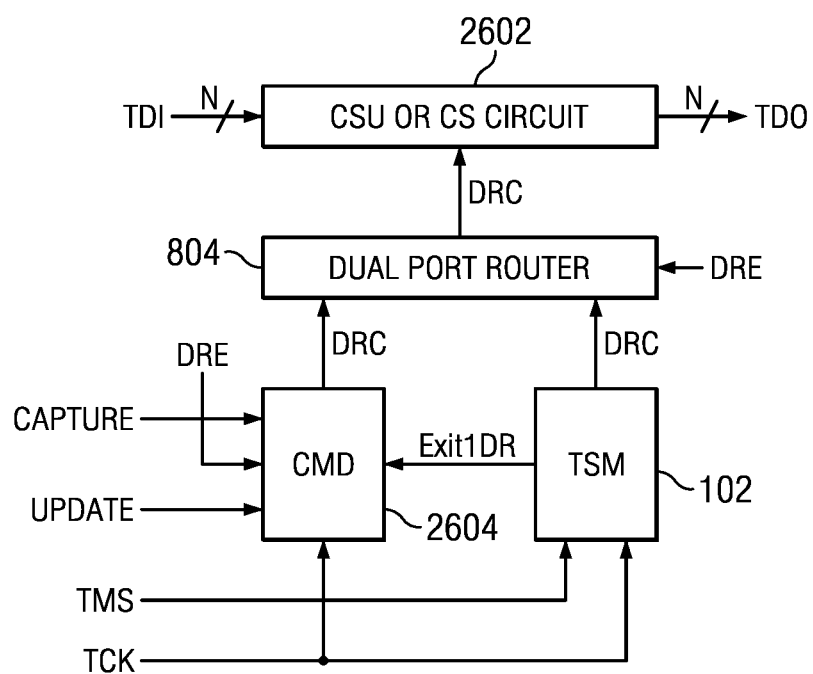
FIG. 33 Illustrates a CSU or CS circuit connectable to a TSM or CMD circuit with additional Capture and Update inputs via a Dual Port Router according to the disclosure.

FIG. 33 illustrates an arrangement including a circuit block 2602, Dual Port Router 804, TSM 102 and CMD circuit 2604. FIG. 33 is identical to FIG. 26 with the exception that the TSM has been modified, as previously described in FIG. 31 to output CMD signals to the CMD circuit 2604 via gating circuitry 2904 during the Exit1DR state and clock signals to the Dual Port Router via gating circuitry 3104 during other selected TSM states. As described in regard to FIGS. 26, 27 and 28, the DRC inputs to the circuit block 2602 from the Dual Port Router may be controlled by either the CMD circuit or from a tester connected to externally accessible Capture and Update signals.

Figure 34A:
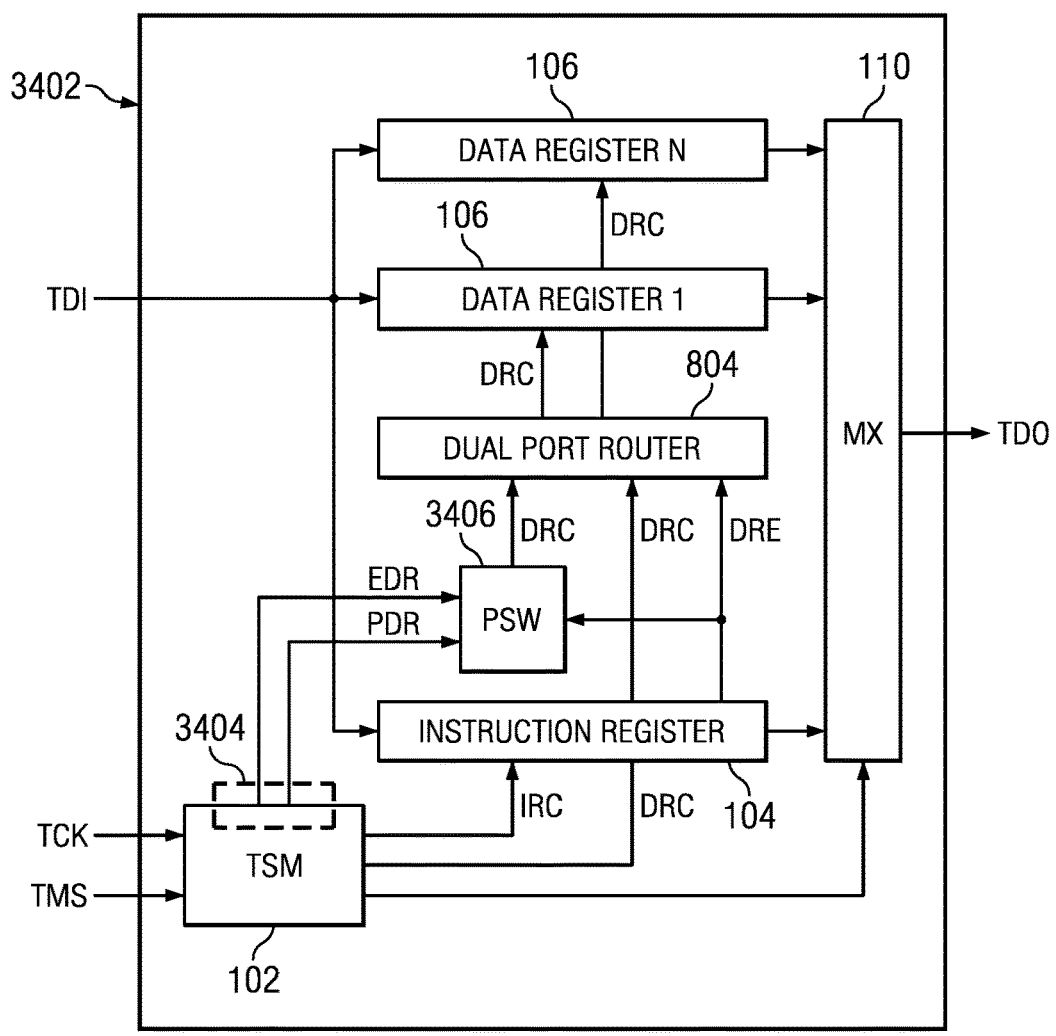
FIG. 34A illustrates an IEEE 1149.1 TAP augmented with a programmable switch (PSW) circuit that receives control signals from the TSM according to the disclosure.
Figure 34B:
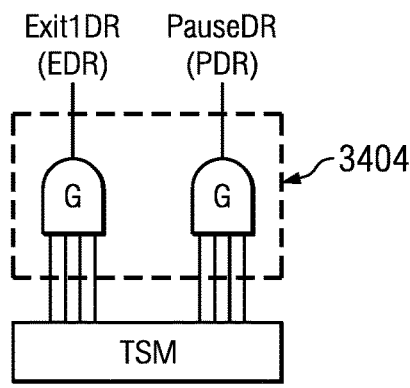
FIG. 34B illustrates gating circuitry for outputting control signals to the PSW when the TSM is in the Exit1DR or PauseDR states according to the disclosure according to the disclosure.

FIG. 34A illustrates a TAP 3402 that is similar to TAP 2902 of FIG. 29A in that it includes Data Registers 106, Dual Port Router 804, Instruction Register 104, multiplexing circuitry 110 and TSM 102. It differs from TAP 2902 in that TAP 3402 uses a Programmable Switch (PSW) circuit 3406 instead of the CMD circuit 802. The TSM 102 has been augmented with TSM state detecting circuitry 3404. The TSM state detecting circuitry is implemented to detect the Exit1DR and PauseDR states as shown in the example of FIG. 34B. The detected Exit1DR (EDR) and detected PauseDR (PDR) TSM state signals are input to the PSW circuit along with DRE input from the instruction register. The PSW circuit outputs DRC control to the Dual Port Router 804 to control Capture and Shift, Capture, Shift and Update or Back to Back Capture and Shift operations on a selected one or more data registers. The DRE input to the PSW circuit programs it to couple the EDR and PDR signals to appropriate DRC signals as needed to perform a CSOP, CSUOP or B2BCSOP operations on a data register.

Figure 35:
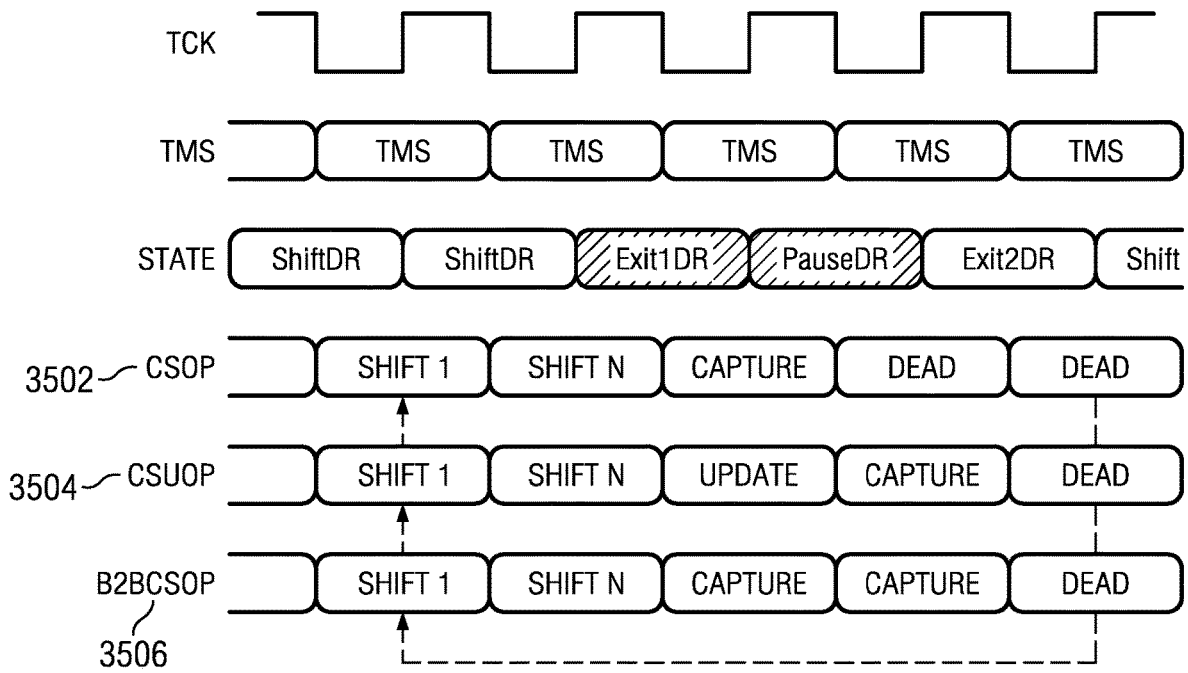
FIG. 35 illustrates a timing diagram of the TSM outputting control signals to the PSW circuit to perform CSOP, CSUOP and B2BCSOP operations according to the disclosure.

FIG. 35 illustrates the timing diagram of the TSM transitioning through states to perform CSOP operations 3502, CSUOP operations 3504 and B2BCSOP operations 3506 using the state detecting circuitry 3404 and the PSW circuit 3406. During CSOP operations 3502, a detected Exit1DR state passes through the PSW to cause the Dual Port Router to output DRC control to perform a Capture operation on a selected data register. During CSUOP operations 3504, a detected Exit1DR state passes through the PSW to cause the Dual Port Router to output DRC control to perform an Update operation on a selected data register and a detected PauseDR state passes through the PSW to cause the Dual Port Router to output DRC control to perform a Capture operation on the selected data register. During B2BCSOP 3506 operations, a detected Exit1DR state passes through the PSW to cause the Dual Port Router to output DRC control to perform a first Capture operation on a selected data register and a detected PauseDR state passes through the PSW to cause the Dual Port Router to output DRC control to perform a second Capture operation on the selected data register.

Like the timing diagram of FIG. 30, the timing diagram of FIG. 35 includes dead states. As seen, two dead states occur during CSOP operations 3502, one dead state occurs during CSUOP operations 3504 and one dead state occurs during B2BCSOP operations 3506. The dead states are not troublesome since they occur after the desired at-speed Capture operation during CSOP cycles 3502, after the desired at-speed Update and Capture operations during CSUOP cycles 3504 and after the desired at-speed Back to Back Capture operations during B2BCSOP cycles 3506.

Figure 36:
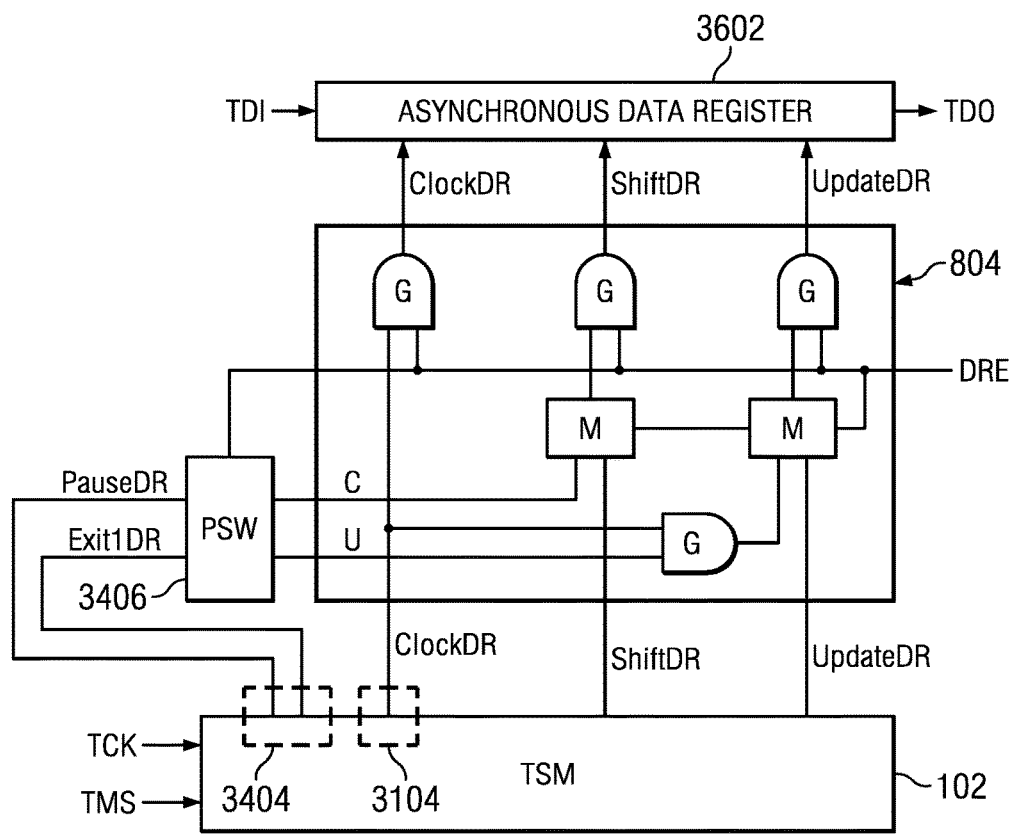
FIG. 36 illustrates a data register being controlled by a PSW that receives control signals from the TSM according to the disclosure.

FIG. 36 illustrates an asynchronous register 3602, Dual Port Router 804, TSM 102 and PSW circuit 3406 all connected as shown. Asynchronous data register 3602 could be an asynchronous CSU data register 402 or an asynchronous CS data register 602.

If data register 3602 is an asynchronous CSU data register 402, the PSW 3406 will be programmed by DRE input to couple the Exit1DR signal from the detecting circuit 3404 to the Update (U) signal output of the PSW and the PauseDR signal output from the detecting circuit 3404 to the Capture (C) output of the PSW. When the TSM transitions through the detectable Exit1DR state, the Update (U) output of the PSW is asserted and is applied, via the Dual Port Router, to the UpdateDR input of the CSU data register to perform the Update operation. When the TSM transitions through the detectable PauseDR state, the Capture (C) output of the PSW is asserted and is applied, via the Dual Port Router, to the ShiftDR input of the CSU data register to perform the Capture operation.

If data register 3602 is an asynchronous CS data register 602, and a CSOP operation is to be performed on the register, the PSW 3406 will be programmed by DRE input to couple the Exit1DR signal from the detecting circuit 3404 to the Capture (C) signal output of the PSW. When the TSM transitions through the detectable Exit1DR state, the Capture (C) output of the PSW is asserted and is applied, via the Dual Port Router, to the ShiftDR input to the CS data register to perform a Capture operation.

If data register 3602 is an asynchronous CS data register 602, and a B2BCSOP operation is to be performed on the register, the PSW 3406 will be programmed by DRE input to couple the Exit1DR signal from the detecting circuit 3404 to the Capture (C) signal output of the PSW and the PauseDR signal from the detecting circuit 3404 to the Capture (C) signal output of the PSW. When the TSM transitions through the detectable Exit1DR state, the Capture (C) output of the PSW is asserted and is applied, via the Dual Port Router, to the ShiftDR input to the CS data register to perform the first Capture operation. When the TSM transitions through the detectable PauseDR state, the Capture (C) output of the PSW is again asserted and is applied, via the Dual Port Router, to the ShiftDR input to the CS data register to perform the second Capture operation.

As seen in FIG. 36, the TSM is augmented with the previously described ClockDR gating circuitry 3104 to provide clock signals on ClockDR during required TSM states, as described in FIG. 32, to perform the above described PSW controlled CSOP, CSUOP and B2BCSOP operations. The PSW circuit 3406 can be designed in many ways, including ways that use gating circuitry and multiplexers that are controlled by DRE input and ways that use gating circuitry and crossbar switches that are controlled by DRE input.

Figure 37:
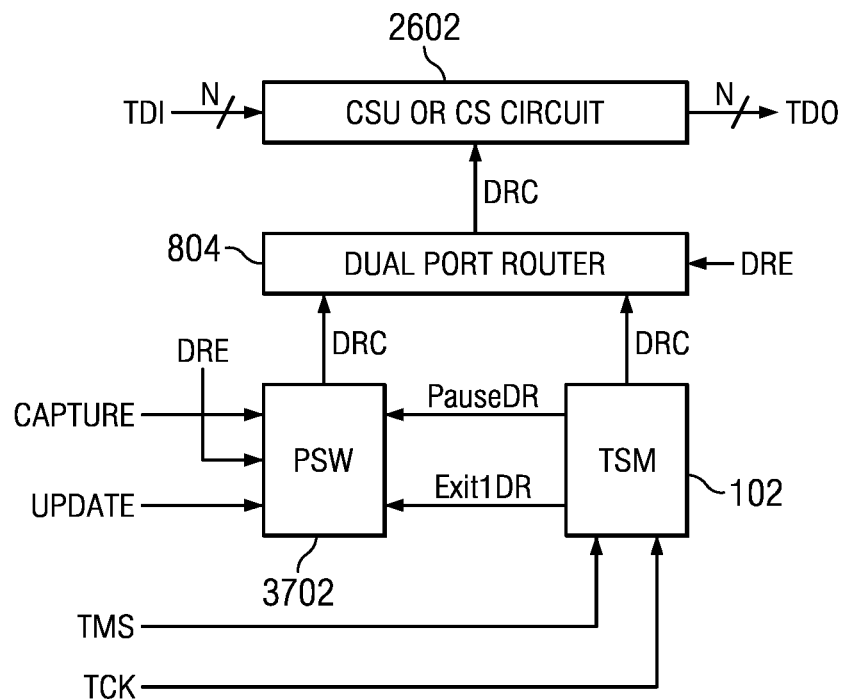
FIG. 37 Illustrates a CSU or CS circuit connectable to a TSM or PSW circuit with additional Capture and Update inputs via a Dual Port Router according to the disclosure.
Figure 38:
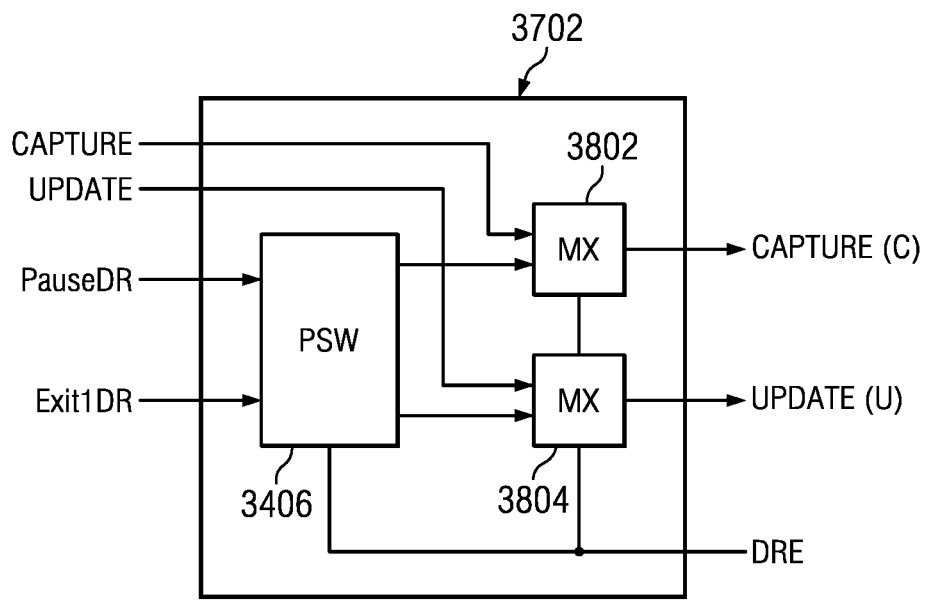
FIG. 38 illustrates a PSW circuit with Capture and Update inputs according to the disclosure.

FIG. 37 illustrates an arrangement including a circuit block 2602, Dual Port Router 804, TSM 102 and a new PSW circuit 3702 all connected as shown. As shown in FIG. 38, the new PSW circuit 3702 includes the previously described PSW circuit 3406 and two multiplexers 3802 and 3804. The PSW circuit 3406 inputs Exit1DR and PauseDR signals from the previously described detection circuitry 3404 of TSM 102 and inputs DRE input from the instruction register. The PSW circuit 3406 outputs a signal to multiplexer 3802 and a signal to multiplexer 3804. Multiplexer 3802 inputs the signal from PSW 3406, a Capture signal, a DRE control input signal and outputs a Capture (C) signal. Multiplexer 3804 input the signal from PSW 3406, an Update signal, a DRE control input signal and outputs an Update (U) signal. The new PSW 3702 can operate in two modes as determined by DRE input. The first mode is identical to that described in FIGS. 34A and 36 where the PSW 3406 responds to detected Exit1DR and PauseDR state signals to control the Capture (C) and Update (U) outputs of the new PSW 3702 via the multiplexers 3802 and 3804. The second mode allows the Capture (C) and Update (U) outputs of the new PSW 3702 to be controlled by the Capture and Update signals to multiplexers 3802 and 3804. As mentioned previously in FIGS. 26 and 33, the Capture and Update signals can be controlled directly by an tester during wafer and package device manufacturing test while the TAP 102 is in the ShiftDR state to more efficiently control CSOP, CSUOP and B2BCSOP test operations.

Figure 39:
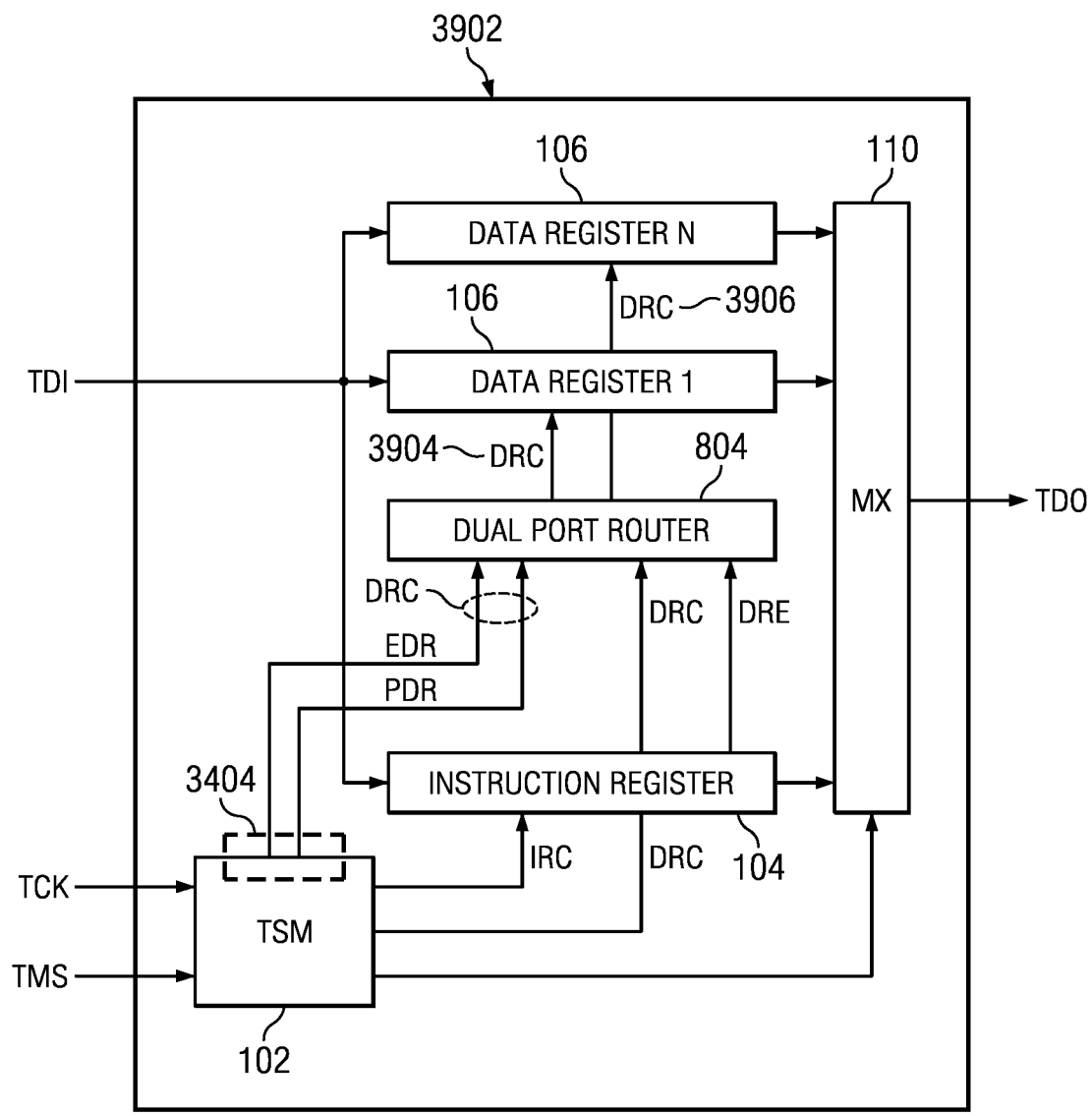
FIG. 39 illustrates an IEEE 1149.1 TAP augmented with TSM Exit1DR and PauseDR state detection circuitry and a Dual Port Router according to the disclosure.

FIG. 39 illustrates a TAP 3902 that is similar to TAP 3402 of FIG. 34A in that it includes Data Registers 106, Dual Port Router 804, Instruction Register 104, multiplexing circuitry 110 and TSM 102. TAP 3902 differs from TAP 3402 in that it does not include a PSW circuit 3406. As seen, the TSM's Exit1DR (EDR) and PauseDR (PDR) state detection signals from state the detection circuit 3404 are coupled directly to the DRC inputs of the Dual Port Router. The Dual Port Router 804 is designed to respond to DRE input to couple the EDR and PDR signals to a selected data register to allow the data register to perform a CSOP, CSUOP or B2BCSP operations, as described in FIG. 35, in response to the signals.

In a first example, if Data Register 1 is a CS Data Register and a CSOP operation 3502 as shown in FIG. 35 is to be performed, the DRE instruction inputs will control the Dual Port Router 804 to couple the EDR signal to the DRC 3904 inputs to Data Register 1 to control when the Capture operation occurs. If the CS Data Register is an asynchronous 602 type register, this means the EDR signal would be coupled to the ShiftDR input of the register, via the DRC output 3904 of the Dual Port Router 804.

In a second example, if Data Register N is a CSU Data Register and a CSUOP operation 3504 as shown in FIG. 35 is to be performed, the DRE instruction inputs will control the Dual Port Router to couple the EDR and PDR signals to the DRC 3906 inputs to Data Register N to control when the Update and Capture operations occur. If the CSU Data Register is an asynchronous 402 type register, this means the EDR signal would be coupled to the UpdateDR input of the register and the PDR signal would be coupled to the ShiftDR input of the register, via the DRC output 3906 of the Dual Port Router 804.

Figure 40:
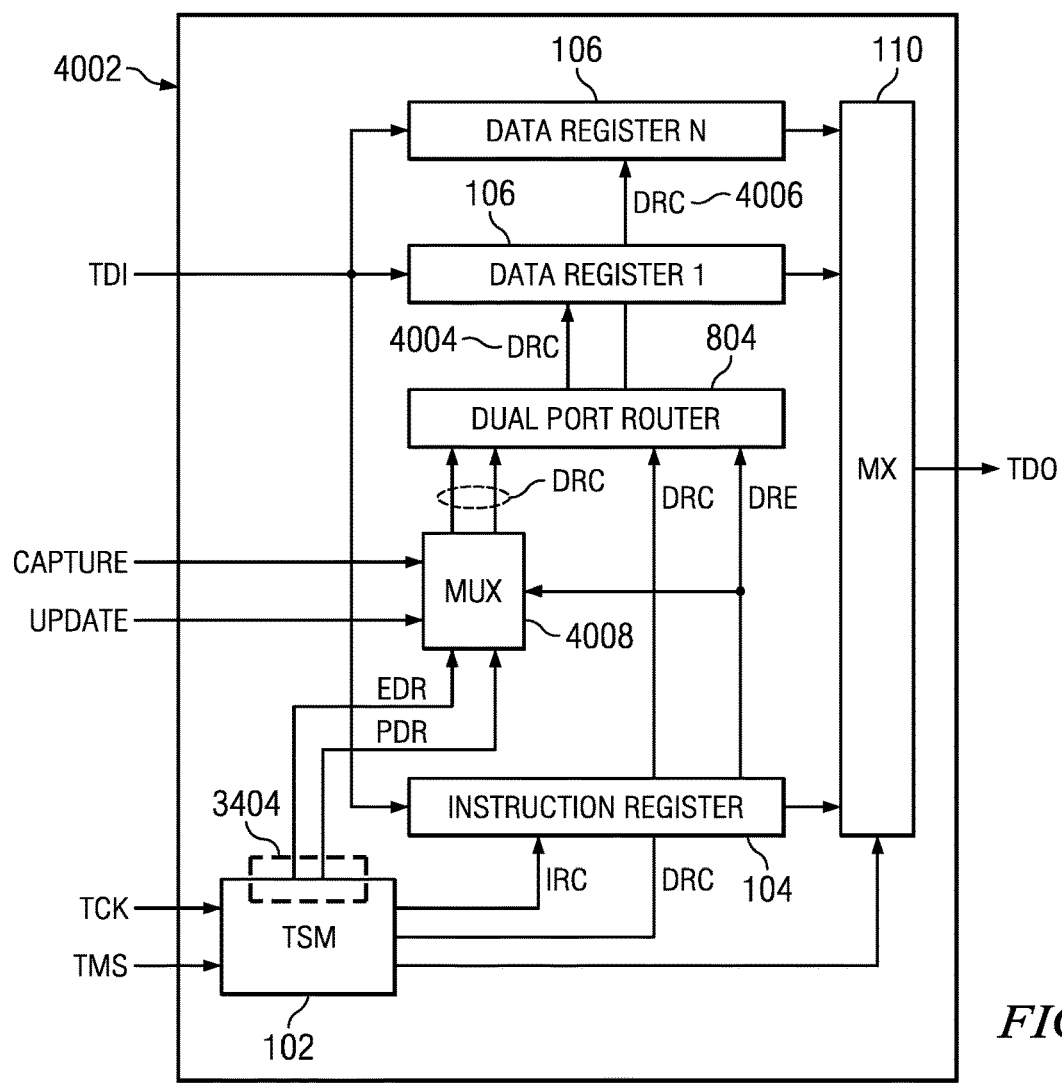
FIG. 40 illustrates an IEEE 1149.1 TAP augmented with TSM Exit1DR and PauseDR state detection circuitry, a multiplexer and a Dual Port Router according to the disclosure.

FIG. 40 illustrates a TAP 4002 that is similar to TAP 3902 of FIG. 39 in that it includes Data Registers 106, Dual Port Router 804, Instruction Register 104, multiplexing circuitry 110 and TSM 102. TAP 4002 differs from TAP 3902 in that it inserts a multiplexer 4008 in the EDR and PDR signal path between the TSM and Dual Port Router. The multiplexer has inputs for an externally accessible Capture and Update signal. The multiplexer is controlled by DRE input to allow the DRC input to the Dual Port Router to be controlled by the EDR and PDR TSM signals or the externally accessible Capture and Update signals. When the EDR and PDR signals are selected to control the DRC inputs to the Dual Port Router, the TAP 4002 operates as described in FIG. 39. When the Capture and Update signals are selected to control the DRC inputs to the Dual Port Router, the TAP 402 operates as described previously in FIGS. 26, 33 and 37.

Figure 41:
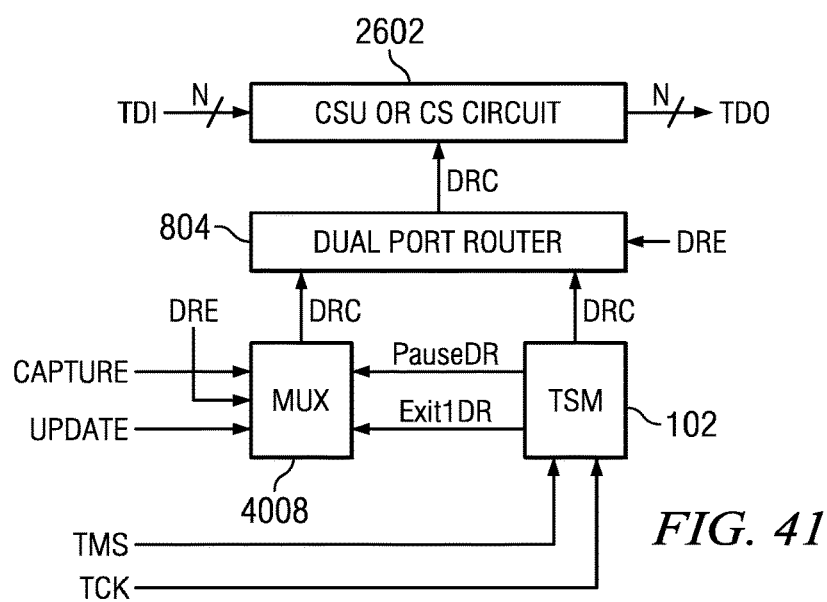
FIG. 41 Illustrates a CSU or CS circuit connectable to a DRC multiplexer via a Dual Port Router according to the disclosure.

FIG. 41 illustrates an arrangement including a circuit block 2602, Dual Port Router 804, TSM 102 and multiplexer 4008 all connected as shown. Multiplexer 4008 inputs the Exit1DR (EDR) and PauseDR (PDR) signals from the TSM, the Capture and Update signals and outputs DRC control to the Dual Port Router as described in FIG. 40. PSW 3406, a Capture signal, a DRE control input signal and outputs a Capture (C) signal. The multiplexer 4008 can operate in two modes as determined by DRE input. The first mode allows the Exit1DR and PauseDR signals to control the DRC input to the Dual Port Router. The second mode allows the Capture and Update signals to control the DRC inputs to the Dual Port Router. As mentioned previously in FIGS. 26 and 33, the Capture and Update signals can be controlled directly by a tester during wafer and package device manufacturing test while the TAP 102 is in the ShiftDR state to more efficiently control CSOP, CSUOP and B2BCSOP test operations to circuit block 2602.

The value of the Dual Port Router is that it allows a target circuit to be controlled conventionally by the TSM or by the new methods described in this disclosure. For example, in FIG. 21 the devices in the daisy-chain arrangement can be selectively controlled by the TSM during standard IEEE 1149.1 Extest instruction operations or they can be controlled by the CMD circuit during the new at-speed Extest instruction operations of this disclosure. According to this disclosure, any standard or non-standard IEEE 1149.1 instruction can have two operation modes. A first operation mode that is controlled conventionally by the TSM via the Dual Port Router and a second operation mode that is controlled according to the teachings of disclosure via the Dual Port Router.

It should be understood that while a Dual Port Router is shown in the embodiments of the disclosure, it is not a required feature of the disclosure. Indeed, if conventional TSM access to a data register 106 or other circuit 2602 is not required, the Dual Port Router may be replaced by another Router capable of receiving DRE input to couple the DRC outputs from a CMD circuit, a PSW circuit, an Exit1DR and PauseDR state detection circuit or from externally accessible Capture and Update signals to the DRC inputs of a data register 106 or a circuit 2602.

The device circuits 106 and 2602 include but or not limited to; device test circuits, device debug circuits, device programming circuits, device instrumentation circuits, device read/write circuits, device trace circuits and device emulation circuits.

Although the disclosure has been described in detail, it should be understood that various changes, substitutions and alterations may be made without departing from the spirit and scope of the disclosure as defined by the appended claims.

What is claimed is:

1. An integrated circuit comprising:
a TDI input, a TDO output, a TCK input and a TMS input;
a TAP state machine (TSM) including an input coupled to the TCK input, an input coupled to the TMS input, an instruction register control output, a TSM data register control (DRC) output, and TSM state detecting circuitry;
an instruction register including an input coupled to the TDI input, a first output coupled to the TDO output, and a control input coupled to the instruction register control output of the TAP state machine;
a multiplexer including a first input coupled to the TSM state detecting circuitry, and a multiplexer output;
router circuitry including a TSM DRC input coupled to the TSM DRC output, a multiplexer DRC input coupled to the multiplexer output, and a router DRC output; and
a data register including an input coupled to the TDI input, an output coupled to the TDO output, and a data register DRC input coupled to the router DRC output.

2. The integrated circuit of claim 1,
wherein the instruction register further includes a data register enable (DRE) output, and
wherein the multiplexer further includes a selection input coupled to the DRE output.

3. The integrated circuit of claim 2, wherein the multiplexer is configured to output, based on a first signal received at the selection input, a second signal received from the TSM state detecting circuitry to the router circuitry.

4. The integrated circuit of claim 1, wherein the multiplexer further includes a second input coupled to a Capture input.

5. The integrated circuit of claim 1, wherein the multiplexer further includes a second input coupled to an Update input.

6. The integrated circuit of claim 1,
wherein the multiplexer further includes a second input coupled to a Capture input and a third input coupled to an Update input, and
wherein the multiplexer is configured to allow signals received at the second and third inputs to control the multiplexer DRC input.

7. The integrated circuit of claim 6,
wherein the Capture input is externally accessible, and
wherein the Update input is externally accessible.

8. The integrated circuit of claim 1, wherein the TSM state detecting circuitry includes an Exit1DR output coupled to the first input of the multiplexer.

9. The integrated circuit of claim 1, wherein the TSM state detecting circuitry includes a PauseDR output coupled to the first input of the multiplexer.

10. The integrated circuit of claim 1,
wherein the multiplexer further includes a second input coupled to a Capture input,
wherein the multiplexer further includes a third input coupled to an Update input,
wherein the TSM state detecting circuitry includes an Exit1DR output coupled to the first input of the multiplexer, and wherein the TSM state detecting circuitry includes a PauseDR output coupled to the first input of the multiplexer.

11. The integrated circuit of claim 10,
wherein the instruction register further includes a data register enable (DRE) output, and
wherein the multiplexer further includes a selection input coupled to the DRE output.

12. The integrated circuit of claim 11,
wherein the multiplexer is configured to operate in a first mode or a second mode based on the DRE output,
wherein in the first mode, the multiplexer is configured to allow signals received at the first input of the multiplexer to control the multiplexer DRC input, and
wherein in the second mode, the multiplexer is configured to allow signals received at the second and third inputs of the multiplexer to control the multiplexer DRC input.

13. The integrated circuit of claim 1, wherein the multiplexer is a first multiplexer, and wherein the integrated circuit further comprises a second multiplexer including:
a first input coupled to the first output of the instruction register;
a second input coupled to the output of the data register; and
an output coupled to the TDO output.

\* \* \* \* \*